United States Patent
Tokuhira et al.

(10) Patent No.: US 11,711,925 B2
(45) Date of Patent: Jul. 25, 2023

(54) MAGNETIC MEMORY

(71) Applicant: Kioxia Corporation, Tokyo (JP)

(72) Inventors: Hiroki Tokuhira, Kawasaki Kanagawa (JP); Tsuyoshi Kondo, Kawasaki Kanagawa (JP); Mutsumi Okajima, Yokkaichi Mie (JP); Yoshihiro Ueda, Yokohama Kanagawa (JP)

(73) Assignee: Kioxia Corporation, Tokyo (JP)

( * ) Notice: Subject to any disclaimer, the term of this patent is extended or adjusted under 35 U.S.C. 154(b) by 309 days.

(21) Appl. No.: 17/189,107

(22) Filed: Mar. 1, 2021

(65) Prior Publication Data

US 2021/0280635 A1 Sep. 9, 2021

(30) Foreign Application Priority Data

Mar. 6, 2020 (JP) .................................. 2020-039086

(51) Int. Cl.
| | |
|---|---|
| H01L 27/22 | (2006.01) |
| H10B 61/00 | (2023.01) |
| G11C 19/08 | (2006.01) |
| H10N 50/01 | (2023.01) |
| H10N 50/80 | (2023.01) |

(52) U.S. Cl.
CPC ......... *H10B 61/00* (2023.02); *G11C 19/0808* (2013.01); *H10N 50/01* (2023.02); *H10N 50/80* (2023.02)

(58) Field of Classification Search
CPC .... H01L 27/222; H01L 43/02; G11C 19/0808
See application file for complete search history.

(56) References Cited

U.S. PATENT DOCUMENTS

| | | | |
|---|---|---|---|
| 9,293,696 B2 | 3/2016 | Ootera et al. | |
| 9,847,476 B2 | 12/2017 | Annunziata et al. | |
| 2016/0056205 A1* | 2/2016 | Nakamura | G11C 11/1673 257/421 |

FOREIGN PATENT DOCUMENTS

| | | |
|---|---|---|
| JP | 6271350 B2 | 1/2018 |
| JP | 2019-33121 A | 2/2019 |

* cited by examiner

*Primary Examiner* — Shih Tsun A Chou
(74) *Attorney, Agent, or Firm* — Finnegan, Henderson, Farabow, Garrett & Dunner, LLP

(57) ABSTRACT

A magnetic memory of an embodiment includes: a first magnetic member including a first and second portions and extending in a first direction; a first and second wirings disposed to be apart from the first magnetic member and extending in a second direction intersecting the first direction, the first and the second wirings being separated from each other in a third direction intersecting the first and second directions, the first magnetic member being disposed to be apart from a region between the first wiring and the second wiring in the first direction; and a second magnetic member surrounding at least parts of the first and second wirings, the second magnetic member including a third portion located to be more distant from the first magnetic member, a fourth portion located to be closer to the first magnetic member, and a fifth portion located in the region.

22 Claims, 53 Drawing Sheets

MAGNETIC MEMORY

CROSS REFERENCE TO RELATED APPLICATIONS

This application is based upon and claims the benefit of priority from the prior Japanese Patent Application No. 2020-039086, filed on Mar. 6, 2020, the entire contents of which are incorporated herein by reference.

FIELD

Embodiments described herein relate generally to magnetic memories.

BACKGROUND

Magnetic memories in which domain walls of magnetic members are moved (shifted) by electric currents caused to flow through the magnetic members are known. In such a magnetic memory, a leading portion formed of a magnetic material is connected to one end of each magnetic member having a cylindrical shape, and a wiring is connected to the other end. A field line for writing data (magnetization direction) to the leading portion is disposed near the leading portion. The domain walls are moved by applying a shift current, which is intended to shift the domain walls of the magnetic member, between the one end and the other end of the magnetic member.

The magnetic memories containing such a structure have a problem in that the write efficiency may be decreased.

DETAILED DESCRIPTION

A magnetic memory according to an embodiment includes: a first magnetic member including a first portion and a second portion and extending in a first direction from the first portion to the second portion; a first wiring and a second wiring disposed to be apart from the first magnetic member and extending in a second direction that intersects the first direction, the first wiring and the second wiring being separated from each other in a third direction that intersects the first direction and the second direction, the first magnetic member being disposed to be apart from a region between the first wiring and the second wiring in the first direction; and a second magnetic member surrounding at least a part of the first wiring and at least a part of the second wiring, the second magnetic member including a third portion that is located to be more distant from the first magnetic member than the first wiring and the second wiring in the first direction, a fourth portion that is located to be closer to the first magnetic member than the first wiring and the second wiring in the first direction and electrically connected to the first portion of the first magnetic member, and a fifth portion that is located in the region between the first wiring and the second wiring and electrically connected to the third portion and the fourth portion.

Embodiments will now be described with reference to the accompanying drawings.

First Embodiment

Figure 1A:
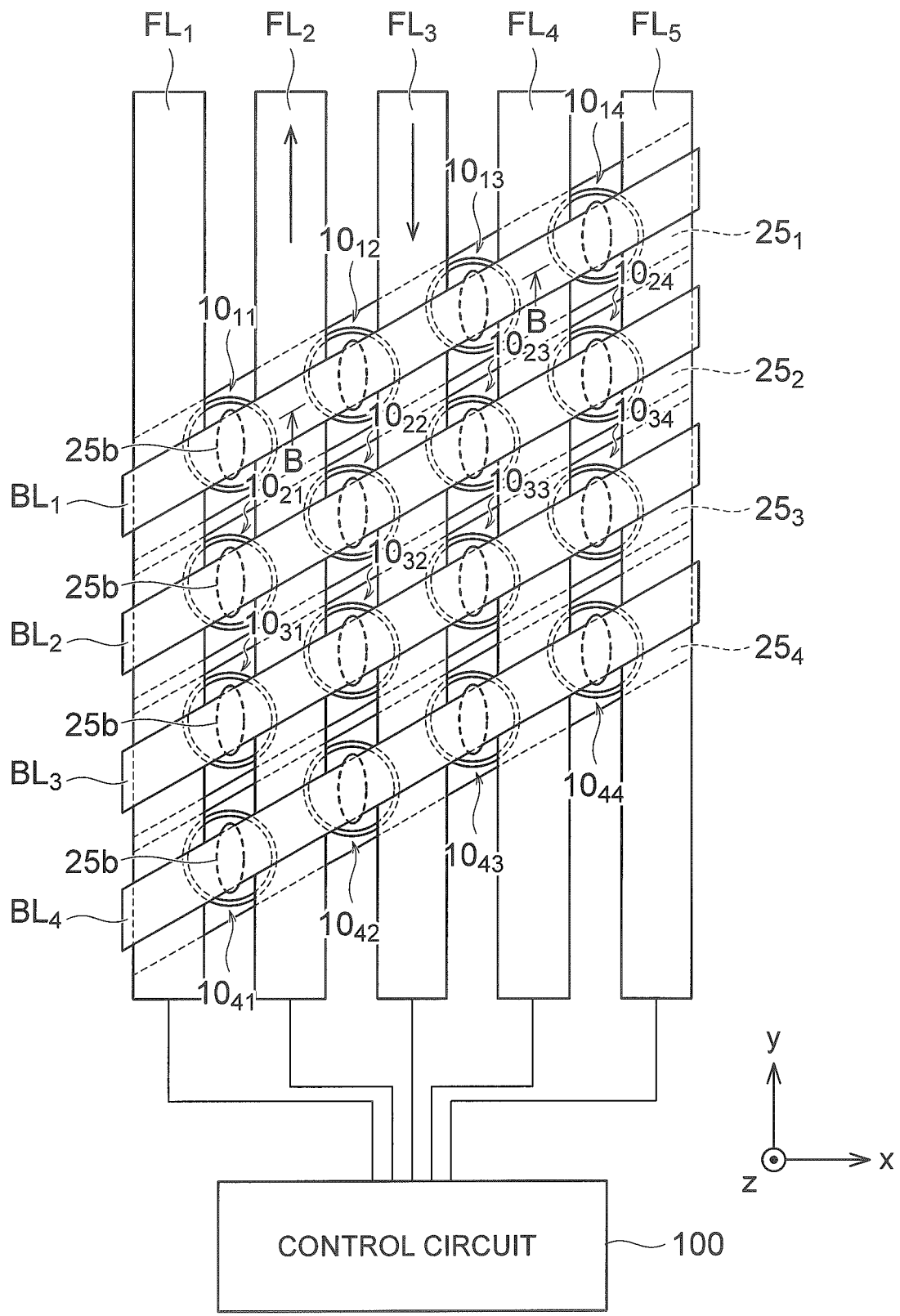
FIG. 1A is a plan view of a magnetic memory according to a first embodiment.
Figure 1B:
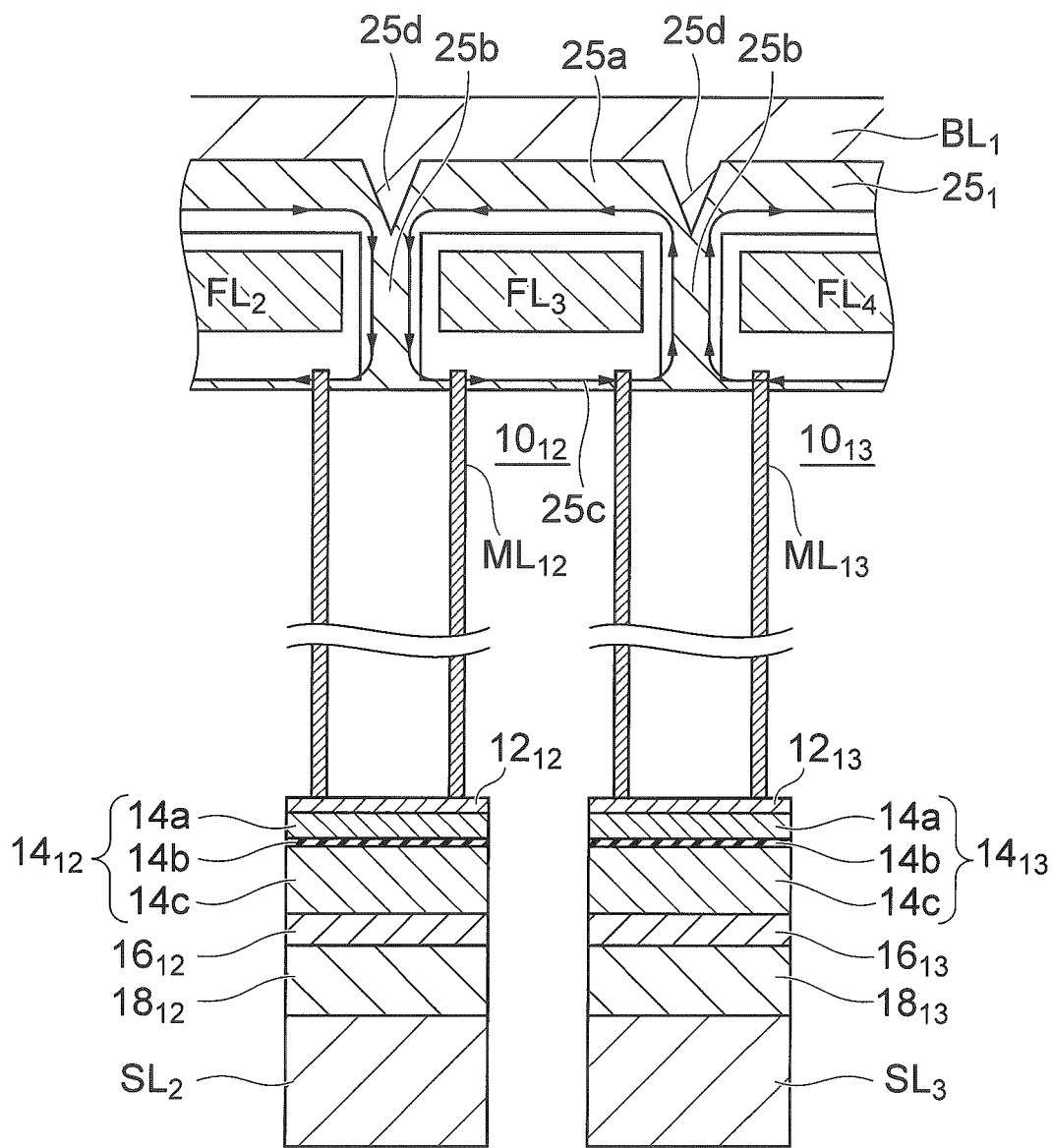
FIG. 1B is a cross sectional view of the magnetic memory according to the first embodiment.

FIG. 1A is a plan view of a magnetic memory according to a first embodiment, and FIG. 1B is a cross sectional view of the magnetic memory according to the first embodiment taken along line B-B in FIG. 1A. The magnetic memory according to the first embodiment includes memory cells $10_{11}$ to $10_{44}$ arranged in four rows and four columns, as shown in FIG. 1A. Although the magnetic memory according to the first embodiment including 4×4 memory cells represents the first embodiment, the memory cells may be arranged in m rows and n columns where m and n are natural numbers.

The memory cells $10_{i1}$ to $10_{i4}$ in an i-th (i=1, . . . , 4) row are arranged to form a predetermined angle with a horizontal direction (x axis direction) in FIG. 1A. The memory cells $10_{1j}$ to $10_{4j}$ in a j-th (j=1, . . . , 4) columns are arranged in a vertical direction (y axis direction) in FIG. 1A. Therefore, the memory cells are disposed to be staggered form when viewed in the x axis direction. Due to this arrangement, the memory cells may be densely disposed.

Two field lines are disposed corresponding to the memory cells $10_{1j}$, $10_{2j}$, $10_{3j}$, and $10_{4j}$ (j=1, . . . , 4) disposed to the j-th (j=1, . . . , 4) columns. For example, field lines $FL_2$ and $FL_3$ are disposed corresponding to memory cells $10_{12}$, $10_{22}$, $10_{32}$, and $10_{42}$ disposed to the second column. The field line $FL_2$ is disposed above a region between the memory cells $10_{i1}$ (i=1, . . . , 4) in the first column and the memory cells $10_{i2}$ (i=1, . . . , 4) in the second column, overlapping a portion of each memory cell $10_{i1}$ (i=1, . . . , 4) in the first column and a portion of each memory cell $10_{i2}$ (i=1, . . . , 4) in the second column.

The field line $FL_3$ is disposed above a region between the memory cells $10_{i2}$ (i=1, . . . , 4) in the second column and the memory cells $10_{i3}$ (i=1, . . . , 4) in the third column, overlapping a portion of each memory cell $10_{i2}$ (i=1, . . . , 4) in the second column and a portion of each memory cell $10_{i3}$ (i=1, . . . , 4) in the third column.

A field line $FL_4$ is disposed above a region between the memory cells $10_{i3}$ (i=1, . . . , 4) in the third column and the memory cells $10_{i4}$ (i=1, . . . , 4) in the fourth column, overlapping a portion of each memory cell $10_{i3}$ (i=1, . . . , 4)

in the third column and a portion of each memory cell $10_{i4}$ (i=1, ..., 4) in the fourth column.

A field line $FL_1$ is disposed on the opposite side of the memory cells $10_{i1}$ (i=1, ..., 4) disposed in the first column relative to the field line $FL_2$. The field line $FL_1$ overlaps a portion of each memory cell $10_{i1}$ (i=1, ..., 4) in the first column. A field line $FL_5$ is disposed on the opposite side of the memory cells $10_{i4}$ (i=1, ..., 4) in the fourth column relative to the field line $FL_3$. The field line $FL_5$ overlaps a portion of each memory cell $10_{i4}$ (i=1, ..., 4) in the fourth column. Each field line $FL_j$ (j=1, ..., 5) is connected to and controlled by a control circuit 100.

A yoke $25_i$ (i=1, ..., 4) formed of a conductive, soft magnetic material is disposed above the memory cells $10_{i1}$, $10_{i2}$, $10_{i3}$, and $10_{i4}$ disposed in the i-th row. The yokes $25_i$ (i=1, ..., 4) are separate from each other and disposed above the respective field lines $FL_1$ to $FL_5$. A bit line $BL_i$ is disposed on and electrically connected to each yoke $25_i$ (i=1, ..., 4). Each bit line $BL_i$ (i=1, ..., 4) is disposed along a direction in which the memory cells $10_{i1}$, $10_{i2}$, $10_{i3}$, and $10_{i4}$ in the i-th (i=1, ..., 4) row are arranged. The bit lines $BL_i$ (i=1, ..., 4) are connected to and controlled by the control circuit 100.

Each memory cell $10_{ij}$ (i, j=1, ..., 4) includes a magnetic memory line (magnetic member) formed of a conductive magnetic material, a nonmagnetic conductive layer $12_{ij}$, a magnetoresistive element $14_{ij}$, a nonmagnetic conductive layer $16_{ij}$, and a switching portion $18_{ij}$ as shown in FIG. 1B.

Each magnetic member $ML_{ij}$ (i, j=1, ..., 4) is formed of a perpendicular magnetic material and in a cylindrical shape extending in the vertical direction in FIG. 1B. A first end of each magnetic member $ML_{ij}$ (i, j=1, ..., 4) is electrically and magnetically connected to a corresponding yoke $25_i$, and a second end is electrically connected to the magnetoresistive element $14_{ij}$. The description "A and B are electrically connected" herein means that A and B may be both directly connected and indirectly connected via a conducting member. The description "A is magnetically connected to B" herein means that A and B constitute a magnetic circuit.

The magnetoresistive element $14_{ij}$ (i, j=1, ..., 4) reads data written to the magnetic member and may be a magnetic tunnel junction (MTJ) element. In the following descriptions, the magnetoresistive element $14_{ij}$ (i, j=1, ..., 4) is an MTJ element. The MTJ element $14_{ij}$ (i, j=1, ..., 4) includes a free layer $14a$ in which the magnetization direction is variable, a fixed layer $14c$ in which the magnetization direction is fixed, and a nonmagnetic layer $14b$ disposed between the free layer (magnetization free layer) $14a$ and the fixed layer $14c$. The free layer $14a$ in each MTJ element $14_{ij}$ (i, j=1, ..., 4) is electrically connected to the second end of the magnetic member $ML_{ij}$ via a corresponding nonmagnetic conductive layer $12_{ij}$, and the fixed layer $14c$ is electrically connected to a corresponding switching portion $18_{ij}$ via a corresponding nonmagnetic conductive layer $16_{ij}$. The feature that "magnetization direction is variable" means that the magnetization direction may be changed by the stray magnetic field from a corresponding magnetic member $ML_{ij}$ (i, j=1, ..., 4) during a read operation, which will be described later, and the feature that "magnetization direction is fixed" means that the magnetization direction is not changed by the stray magnetic field from the corresponding magnetic member $ML_{ij}$ (i, j=1, ..., 4).

Each switching portion $18_{ij}$ (i, j=1, ..., 4) is disposed between the nonmagnetic conductive layer $16_{ij}$ and the source line $SL_j$, and connected to the source line $SL_j$. Each source line $SL_j$ (j=1, ..., 4) extends in a direction that intersects the surface of FIG. 1B, and electrically connected to the switching portions of the memory cells $10_{ij}$ (i=1, ..., 4) arranged in the same column in FIG. 1A. The source lines $SL_j$ (j=1, ..., 4) are connected to and controlled by the control circuit 100 shown in FIG. 1A.

Each switching portion $18_{ij}$ (i, j=1, ..., 4) may be a two-terminal switching element, for example. If a voltage that is equal to or less than a threshold value is applied across the two terminals, the switching portion $18_{ij}$ (i, j=1, 2) is in a "high-resistance" state, which means an electrically nonconductive state, for example. If a voltage that is greater than the threshold value is applied across the two terminals, the switching portion $18_{ij}$ (i, j=1, 2) is in a "low-resistance" state, which means an electrically conductive state, for example. A switching portion $18_{ij}$ (i, j=1, 2) in an ON state keeps the state as long as a current having a value equal to or greater than a holding current value flows. The switching portions $18_{ij}$ (i, j=1, 2) may have this function regardless of which polarity the voltage has. The switching portions $18_{ij}$ (i, j=1, 2) may comprise at least one chalcogen element selected from a group of Te, Se, and S, for example, or may comprise a chalcogenide, which is a compound of one or more of the above chalcogen elements. The switching elements may also be formed of at least one element selected from B, Al, Ga, In, C, Si, Ge, Sn, As, P, and Sb.

Each yoke $25_i$ (i=1, ..., 4) surrounds a portion of each of the field lines $FL_1$ to $FL_5$ as shown in FIG. 1B. For example, the yoke $25_1$ has a first portion $25a$ covering a top surface of each field line, for example the field line $FL_2$, a second portion ("return yoke") $25c$ disposed under a lower surface of the field line $FL_2$, and a third portion $25b$ connecting the first portion $25a$ and the second portion $25c$ and disposed along a side surface of the field line $FL_2$. The first portion $25a$ is disposed to be apart from the top surface of the field line $FL_2$, the third portion $25b$ is disposed to be apart from the side surface of the field line $FL_2$, and the second portion $25c$ is disposed to be apart from the lower surface of the field line $FL_2$. In the first embodiment, a cross section of the third portion $25b$ and the second portion $25c$ connecting to each other is in an inverted T shape as shown in FIG. 1B.

The third portion $25b$ is disposed above a central portion of the magnetic member $ML_{ij}$ included in each memory cell $10_{ij}$ (i, j=1, ..., 4). The cross section of the third portion $25b$ has an oval shape when viewed from a direction perpendicular to the surface of FIG. 1A. The cross section of the third portion $25b$ may have a circular shape or a rectangular shape. The first portion $25a$, the third portion $25b$, the second portion $25c$, and the third portion $25b$ of the yoke 25 surrounding a corresponding field line form a magnetic circuit for a write operation.

Each yoke $25_i$ (i=1, ..., 4) is disposed in a direction where the memory cells $10_{i1}$, $10_{i2}$, $10_{i3}$, $10_{i4}$ in the i-th row are arranged. Since adjacent yokes are separate from each other, the yokes $25_i$ do not surround the entire surfaces of the respective field lines $FL_j$ (j=1, ..., 5). Therefore, each field line $FL_j$ (j=1, ..., 5) has regions that are not surrounded by yokes between adjacent two of the memory cells $10_{1j}$, $10_{2j}$, $10_{3j}$, and $10_{4j}$ in the j-th column. For example a region that is not surrounded by the yokes $25_1$ and $25_2$ exists above a region between the memory cell $10_{1j}$ and the memory cell $10_{2j}$.

Although the bit lines $BL_1$ to $BL_4$ are disposed above the source lines $SL_1$ to $SL_4$ in the first embodiment, the source lines $SL_1$ to $SL_4$ may be disposed above the bit lines $BL_1$ to $BL_4$.

(Write Operation)

A write operation of the magnetic memory according to the first embodiment will now be described below.

Figure 2A:
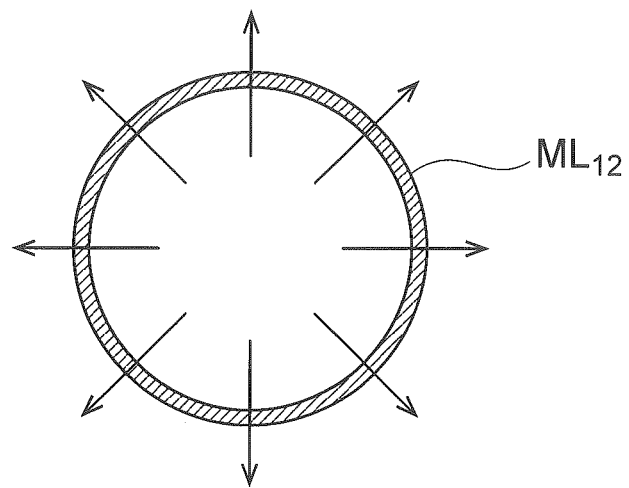
FIGS. 2A and 2B are a top view and a cross sectional view showing examples of data written to a magnetic member.
Figure 2B:
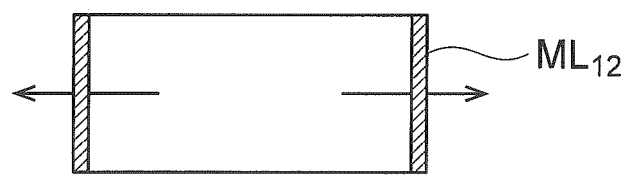

A write operation to write data to each memory cell $10_{ij}$ (i, j=1, . . . , 4) is performed by causing opposite write currents to flow through corresponding two field lines $FL_j$ and $FL_{j+1}$ by means of the control circuit 100. For example, in order to write data to the memory cell $10_{12}$, opposite write currents are caused to flow through the field line $FL_2$ and the field line $FL_3$. If a write current is caused to flow through the field line $FL_2$ in a direction indicated by an arrow shown in FIG. 1A and a write current is caused to flow through the field line $FL_3$ in a direction indicated by an arrow shown in FIG. 1A, a clockwise current-induced magnetic field is generated around the field line $FL_2$ and an anticlockwise current-induced magnetic field is generated around the field line $FL_3$. Those current-induced magnetic fields induce further magnetic fields to the yoke $25_1$ surrounding the respective field lines, as shown in FIG. 1B. Data (magnetization direction) corresponding to the write currents is written to upper portions of the magnetic members $ML_{12}$, $ML_{22}$, $ML_{32}$, and $ML_{42}$ included in the memory cell memory cells $10_{12}$, $10_{22}$, $10_{32}$, and $10_{42}$ in the second column, which are located below a region between the field line $FL_2$ and the field line $FL_3$, for example. The data (magnetization direction) is written outwardly relative to the sidewall of the magnetic member $ML_{12}$ as illustrated in FIGS. 2A and 2B. FIGS. 2A and 2B are a top view and a cross sectional view of the magnetic member $ML_{12}$ illustrating an example of the data written to the magnetic member $ML_{12}$.

Figure 3A:
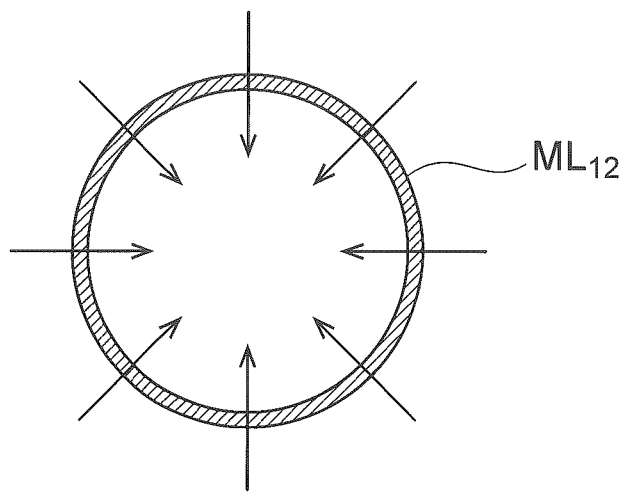
FIGS. 3A and 3B are a top view and a cross sectional view showing examples of data written to the magnetic member.
Figure 3B:
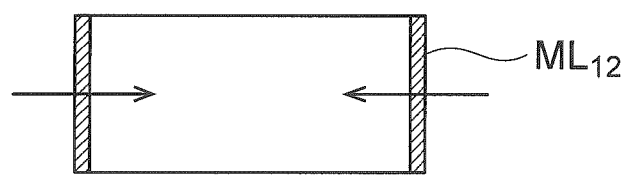

When the directions of the write currents flowing through the field line $FL_2$ and the field line $FL_3$ are reversed from those described above, the data (magnetization direction) is written inwardly to the magnetic member $ML_{12}$ of the memory cell $10_{12}$ relative to the sidewall of the magnetic member $ML_{12}$, as illustrated in FIGS. 3A and 3B. FIGS. 3A and 3B are a top view and a cross sectional view of the magnetic member $ML_{12}$ illustrating an example of the data written to the magnetic member $ML_{12}$.

As the result of the write operation, the data is written to an upper portion of the magnetic member $ML_{12}$. Subsequently, the control circuit 100 causes a shift current to flow between the bit line $BL_1$ and the source line $SL_2$, the shift current moving domain walls of the magnetic member $ML_{12}$, thereby moving the written data downward to be stored in a storage region (shift operation). The polarity of the shift current is determined by the material of the magnetic member $ML_{ij}$ (i, j=1, . . . , 4), for example. The written data is stored in the storage region of the magnetic member $ML_{12}$ in this manner. Although the same data is written to the upper portions of the magnetic members other than the magnetic member $ML_{12}$, i.e., the magnetic members $ML_{22}$, $ML_{32}$, and $ML_{42}$, of the memory cells in the second column, the written data remains in the upper portions of the magnetic members $ML_{22}$, $ML_{32}$, and $ML_{42}$ unless a shift current flows through the bit lines corresponding to those magnetic members. Thus, the upper portions of the respective magnetic members $ML_{ij}$ (i, j=1, . . . , 4) serve as work regions to which data is temporarily written, but not storage regions to which the data is stored.

Figure 4:
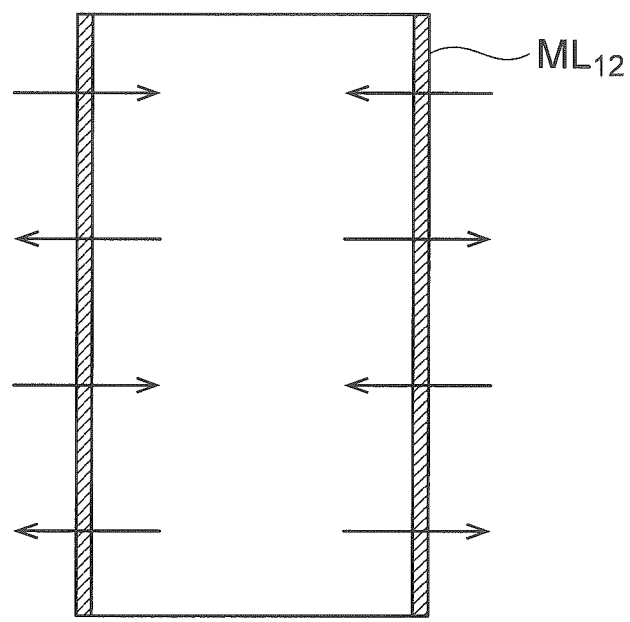
FIG. 4 is a cross sectional view showing an example of data written to the magnetic member.

FIG. 4 is a cross sectional view of the magnetic member $ML_{12}$ after the data is alternately written in the inward magnetization direction and the outward magnetization direction and stored in the storage region of the magnetic member $ML_{12}$.

(Read Operation)

A read operation will then be described. When data is read from a memory cell, for example the memory cell $10_{12}$, if the data is located in the lowest region that is the closest to the bottom of the magnetic member $ML_{12}$ of the memory cell $10_{12}$, or the closest to the MTJ element $14_{12}$, the magnetization direction of the free layer 14a of the MTJ element $14_{12}$ has been changed according to the data stored in the lowest region of the magnetic member $ML_{12}$. Therefore, a read current is caused to flow between the bit line $BL_1$ and the source line $SL_2$ by means of the control circuit 100 to read the data from the MTJ element $14_{12}$. The read data corresponds to the resistance state of the MTJ element $14_{12}$. A high resistance state of the MTJ element $14_{12}$ may mean that the magnetization direction of the free layer 14a differs from that of the fixed layer 14c in the MTJ element $14_{12}$ (for example, an "antiparallel state"), and a low resistance state of the MTJ element $14_{12}$ may mean that the magnetization direction of the free layer 14a and the magnetization direction of the fixed layer 14c in the MTJ element $14_{12}$ are the same ("parallel state").

If the data to be read is not located in the lowest region of the magnetic member $ML_{12}$ of the memory cell $10_{12}$, the data to be read is moved to the lowest portion of the magnetic member $ML_{12}$ by a shift current caused to flow between the bit line $BL_1$ and the source line $SL_2$ by means of the control circuit 100. Thereafter, the above-described read operation is performed to read the data.

In the first embodiment, each yoke $25_i$ (i=1, . . . , 4) has recesses each retracting into the third portion 25b between the first portions 25a of the part surrounding adjacent field lines. For example, each yoke $25_i$ has recesses 25d each in a shape of an inverted triangle when viewed in a cross section. The recesses 25d generate a smooth flow of magnetic field lines from the adjacent first portions 25a to the third portion 25b located therebetween, and enable smooth branching of the magnetic lines of flux from the third portion 25b to the first portions 25a connecting to the third portion 25b, thereby preventing the decrease in the writing magnetic field.

As described above, according to the first embodiment, a yoke is disposed to surround a part of each field line, and a magnetic member (magnetic memory line) is electrically and magnetically connected to a lower part (second portion) of the yoke. Therefore, in a write operation to write data to an upper portion of a magnetic member, write currents are caused to flow through two relating field lines in opposite directions, causing an induced magnetic field to a corresponding yoke, the induced magnetic field writing data to the upper portion of the magnetic member. Therefore, unlike conventional cases, data can be written to the upper portion of the magnetic member without the need of leading electrodes. As the result, no domain wall is fixed to the magnetic member even if a shift current flows through the magnetic member. Thus, the data is prevented from being fixed to an end of the magnetic member.

Figure 5:
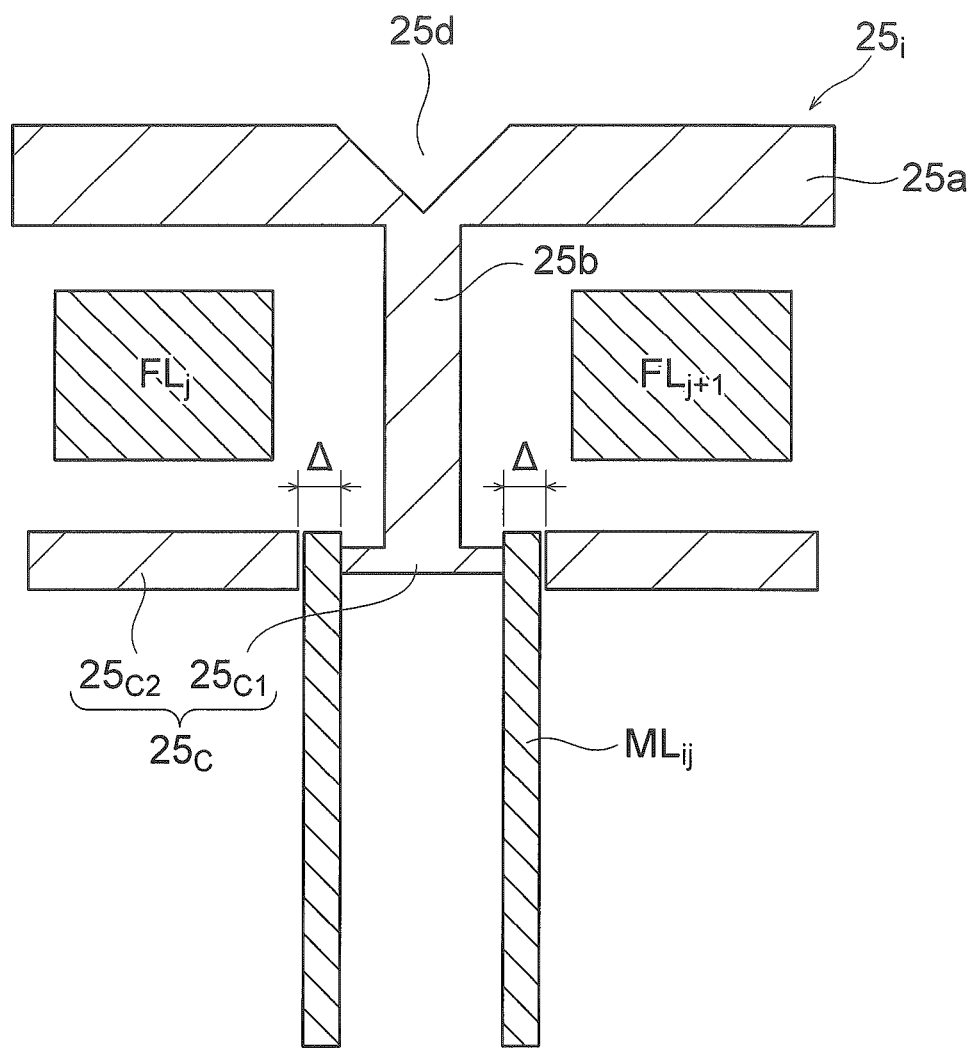
FIG. 5 is a cross sectional view for explaining the structure of a yoke according to the first embodiment.

In the first embodiment, the upper portion of each magnetic member (magnetic memory line) $ML_{ij}$ (i, j=1, . . . , 4) is electrically connected to a portion $25c_1$ of the lower portion of the yoke $25_i$ as shown in FIG. 5. Therefore, the gap A between the portion $25c_1$ and another portion $25c_2$, i.e., the gap A in the magnetic circuit, may be reduced as compared with conventional cases. This may increase the writing magnetic field and prevent a decrease in write efficiency. The portion $25c_1$ of the second portion 25c connects to the third portion 25b of the yoke $25_i$, and the other portion $25c_2$ is located below a corresponding field line. The other portion $25c_2$ may be or may not be electrically connected to the corresponding magnetic member $ML_i$. If the other portion $25c_2$ is not electrically connected, an insulating member is disposed between the other portion $25c_2$ and the corresponding magnetic member $ML_i$.

If, like conventional cases, a leading portion is connected to an end of the magnetic member, and data is written to the leading portion by a magnetic field caused by a write current flowing through a field line, the gap of the magnetic circuit including the leading portion and the field line is the space between the leading portion and the field line since the leading portion and the field line are not electrically connected to each other. This gap is greater than the gap A of the first embodiment.

As described above, the magnetic memory according to the first embodiment is capable of preventing data from being fixed to an end of the magnetic member and the write efficiency from being reduced.

(First Modification)

A magnetic memory according to a first modification of the first embodiment will be described with reference to FIG. 6. The magnetic memory according to the first modification differs from the magnetic memory according to the first embodiment shown in FIGS. 1A and 1B in the cross sectional structure of the yoke $25_i$ (i=1, ..., 4). For example, FIG. 5 shows that the yoke $25_i$ (i=1, ..., 4) of the first embodiment partially surrounds adjacent field lines $FL_i$ and $FL_{i+1}$. The yoke $25_i$ (i=1, ..., 4) has the recesses $25d$ each of which is in a shape of an inverted triangle and located at an upper connecting portion of a third portion $25b$ with a first portion $25a$. However, the portion $25c_i$ of the second portion $25c$ connecting to a lower connecting portion of the third part $25b$ extends in the horizontal direction in FIG. 5. Therefore, the third portion $25b$ and the portion $25c_i$ of the second portion $25c$ have a cross section in a shape of an inverted T. This prevents the magnetic lines of flux from the third portion $25b$ to the portion $25c_1$ from smoothly branching to left and right at the interface with the portion $25c_1$ or the magnetic lines of flux from the portion $25c_i$ to the third portion $25b$ from smoothly joining at the interface with the third portion $25b$. This reduces the writing magnetic field.

Figure 6:
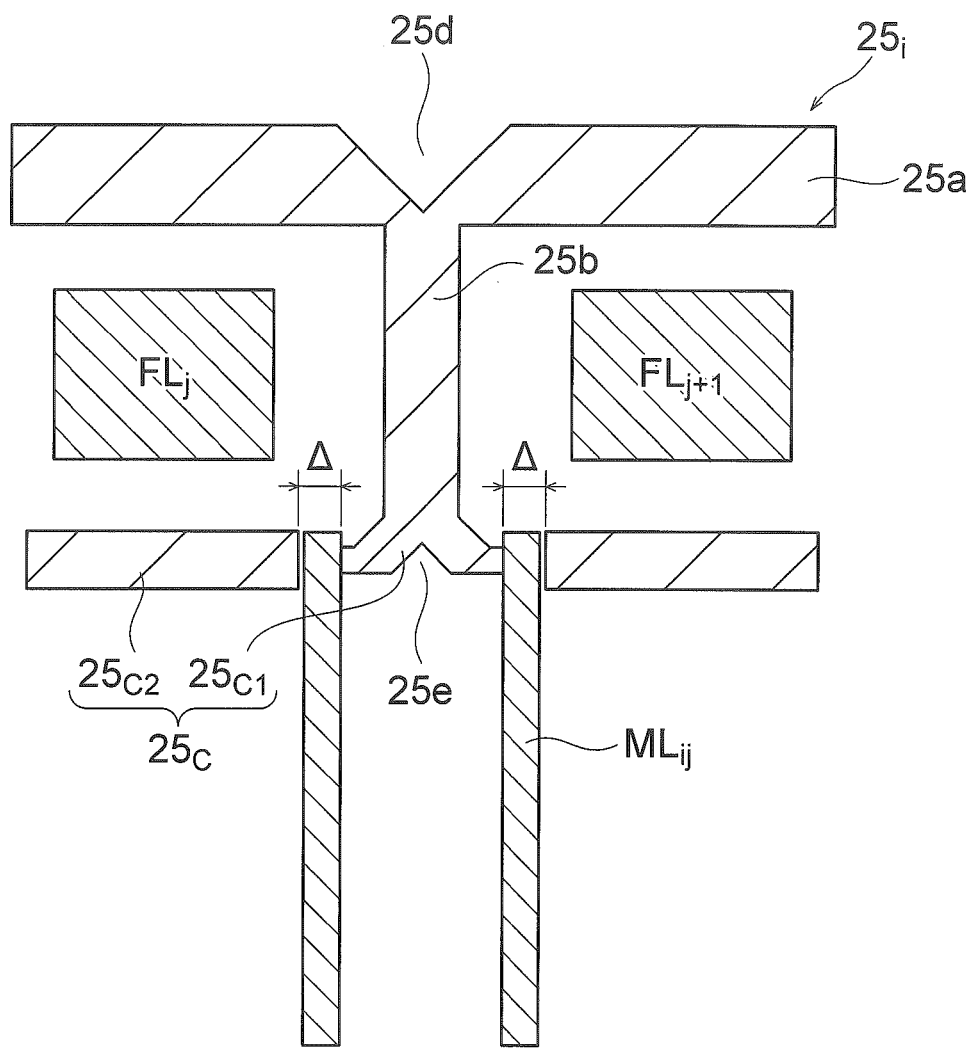
FIG. 6 is a cross sectional view for explaining the structure of a yoke according to a modification of the first embodiment.

In order to solve this problem, the magnetic memory according to the modification of the first embodiment has a portion recessed into the third portion $25b$ in a portion of the second portions $25c$ surrounding adjacent field lines, as shown in FIG. 6. For example, a recess $25e$ having a triangular cross section may be formed at the connection portion between each third portion $25b$ and the corresponding portion $25c_1$ of the yoke $25_i$ (i=1, ..., 4) so that bottom of the third portion $25b$ has a cross section branching to left and right (to form an inverted Y shape). This enables the magnetic lines of flux from the third portion $25b$ to the portion $25c_i$ to smoothly branch to left and right at the interface with the portion $25c_1$ or the magnetic lines of flux from the portion $25c_1$ to the third portion $25b$ to smoothly join at the interface with the third portion $25b$. The writing magnetic field is prevented from reducing.

The magnetic memory according to the modification is capable of preventing data from being fixed to an end of the magnetic member and the write efficiency from being reduced, like the magnetic memory according to the first embodiment.

Second Embodiment

Figure 7A:
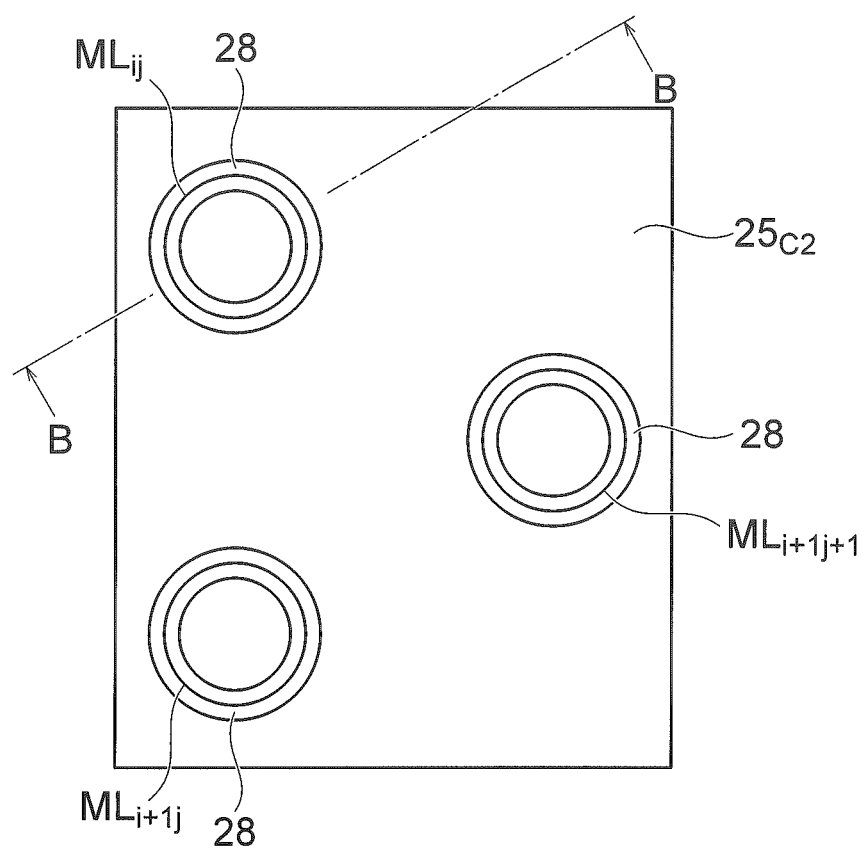
FIG. 7A is a plan view for explaining the structure of a yoke according to a second embodiment.
Figure 7B:
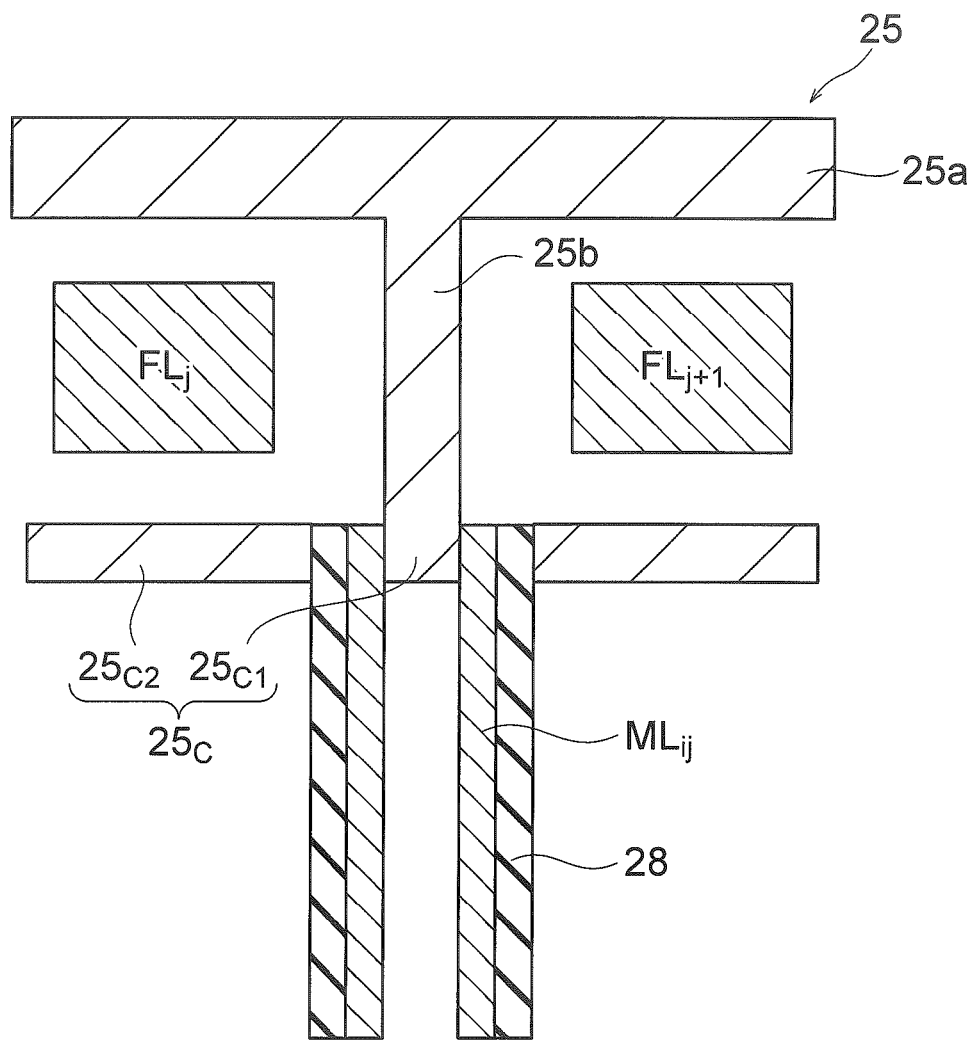
FIG. 7B is a cross sectional view for explaining the structure of the yoke according to the second embodiment.

A magnetic memory according to a second embodiment will be described with reference to FIGS. 7A and 7B. FIG. 7A is a plan view of the magnetic memory according to the second embodiment, and FIG. 7B is a cross sectional view of the magnetic memory according to the second embodiment taken along line B-B shown in FIG. 7A.

The magnetic memory according to the second embodiment differs from the magnetic memory according to the first embodiment shown in FIGS. 1A and 1B in the structure of the yoke. For the other portions, the magnetic memory according to the second embodiment has the same structure as the magnetic memory according to the first embodiment. In the magnetic memory according to the first embodiment, the yokes are disposed in the row direction of the arranged memory cells. The yokes disposed in adjacent rows are separated from each other (FIG. 1A). However, in the second embodiment, the yoke $25c_2$ is not separated but has a continuous structure as shown in FIG. 7A. In other words, the yoke $25c_2$ is shared by a magnetic member $ML_{ij}$ (i, j=1, ..., 4), a magnetic member and a magnetic member the magnetic member being disposed to a row that is different from the row of the magnetic member $ML_{i+1j}$ and the magnetic member as shown in FIG. 7A. Each magnetic member $ML_{ij}$ (i, j=1, ..., 4) is electrically connected to the yoke 25 via the third portion $25b$ and the portion $25c_1$ of the second portion $25c$ of the yoke 25, but electrically isolated from the portion $25c_2$ of the second portion $25c$ of the yoke 25 by an insulating film 28. As shown in FIGS. 7A and 7B, the insulating film 28 is disposed on an outer side face of each magnetic member $ML_{ij}$ (i, j=1, ..., 4).

The write operation, the shift operation, and the read operation of the magnetic memory according to the second embodiment are the same as those of the magnetic memory according to the first embodiment.

With the above-described structure, the magnetic memory according to the second embodiment is capable of preventing the memory cells from malfunctioning to cause erroneous reading, for example, since, when a shift current or a read current is caused to from through one of the magnetic members $ML_{ij}$ (i, j=1, ..., 4), the shift current or the read current does not flow through the magnetic members of the other memory cells.

The yoke of the magnetic memory according to the second embodiment may be formed more easily than the yokes of the magnetic memory according to the first embodiment or the modification of the first embodiment.

The magnetic memory according to the second embodiment is capable of preventing data from being fixed to an end of the magnetic member and the write efficiency from being reduced, like the magnetic memory according to the first embodiment.

Third Embodiment

A method of manufacturing a magnetic memory according to a third embodiment will be described below with reference to FIGS. 8A to 26. The manufacturing method according to the third embodiment relates to the magnetic memory according to the second embodiment shown in FIG. 7A and FIG. 7B.

Figure 8A:
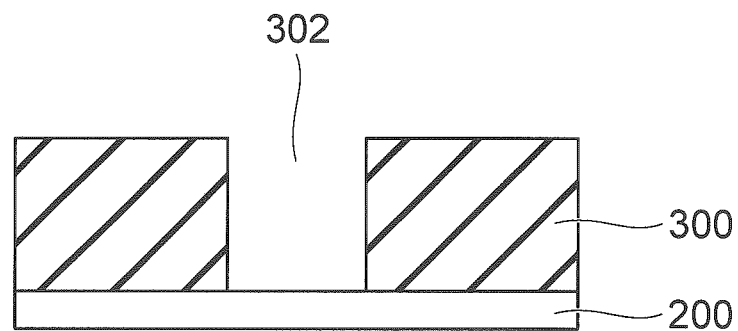
FIGS. 8A to 26 are cross sectional views illustrating processes of a manufacturing method according to a third embodiment.
Figure 8B:
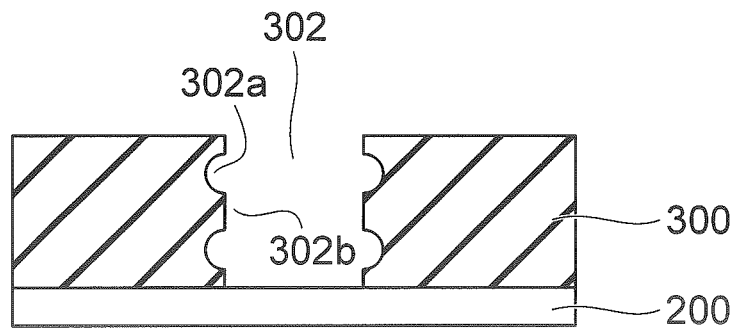

First, as shown in FIG. 8A, a metal layer 300 of aluminum oxide, for example, is formed on a silicon substrate 200. Alternatively, a substrate 300 of aluminum is joined to the silicon substrate 200. On behalf of the metal layer 300 and the substrate 300 of aluminum, the metal layer 300 will be described below. After the metal layer 300 is formed on the silicon substrate 200, the metal layer 300 is subjected to anode oxidation. In the anode oxidation, a current is caused to flow through the metal layer 300 or the silicon substrate 200, which is set as an anode and put in an electrolytic solution (for example, a solution containing any or any combination of sulfuric acid, oxalic acid, and phosphoric acid). The metal layer 300 (aluminum) is oxidized to generate metal ions and dissolve into the solution. The metal ions are bonded with oxygen in the solution to form a metal oxide (aluminum oxide), which grows on the surface of the metal layer 300. Since the dissolving and the growing proceed at the same time, minute holes 302 surrounded by aluminum oxide are formed on the metal layer 300 of aluminum. A first voltage and a second voltage that is different from the first voltage are periodically applied during the formation of the holes 302. While the second voltage is being applied, recessed portions 302a, which has a greater dimension in the horizontal direction (diameter), are formed in each hole 302 (FIG. 8B). The aluminum around regions where the holes 302 are formed changes to aluminum oxide. In the following descriptions, each hole is assumed not to have the recessed portions 302a and projected portions 302b and have a cylindrical shape. FIGS. 8A and 8B and other cross sectional views used in the descriptions are taken along line B-B in FIG. 1A.

Figure 9A:
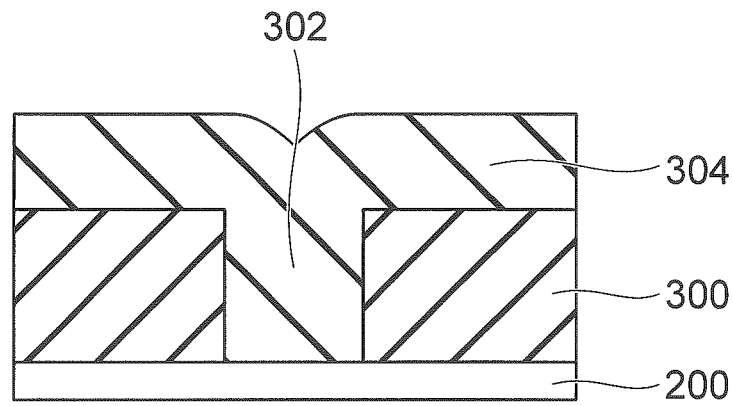
Figure 9B:
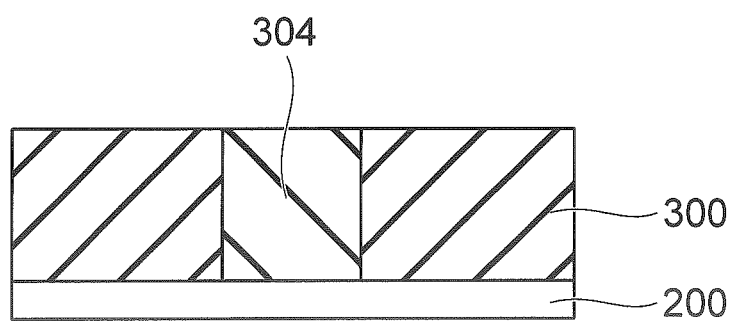

Next, as shown in FIG. 9A, a tetraethyl orthosilicate (TEOS) layer 304 is deposited on the aluminum oxide layer 300 to fill into each hole 302. The TEOS layer 304 is then flattened by chemical mechanical polishing (CMP) so that the surface of the aluminum oxide layer 300 is exposed (FIG. 9B).

Figure 10A:
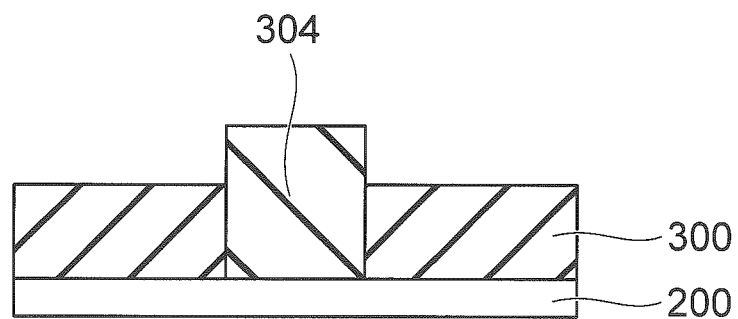
Figure 10B:
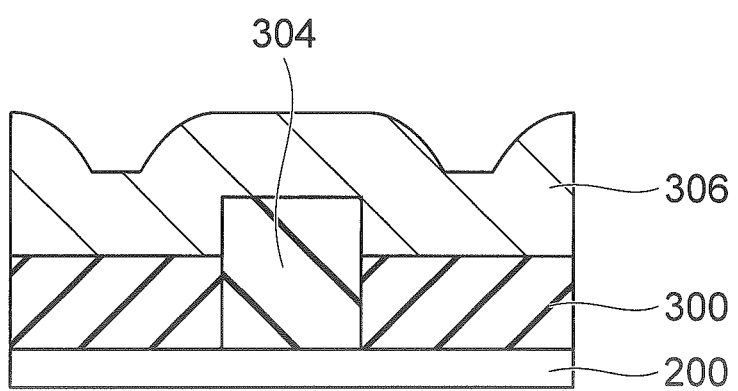

The aluminum oxide layer 300 is then etched so that the surface of the aluminum oxide layer 300 is lower than the surface of the TEOS layer 304, as shown in FIG. 10A. Subsequently, a soft magnetic layer 306 of NiFe, for example, is deposited on the aluminum oxide layer 300 and the TEOS layer 304 by sputtering, for example (FIG. 10B).

Figure 11A:
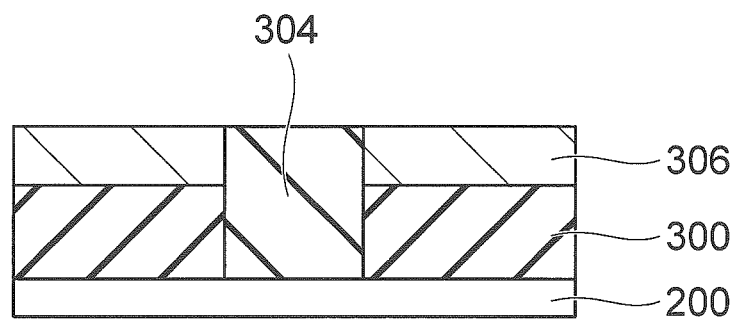
Figure 11B:
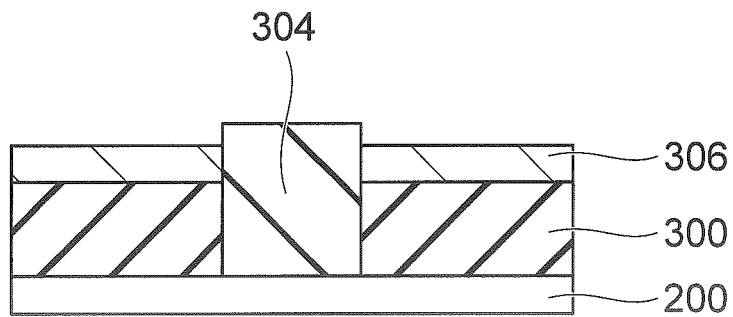

The soft magnetic layer 306 is then flattened by CMP so that the surface of the TEOS layer 304 is exposed, as shown in FIG. 11A. The soft magnetic layer 306 is then etched so that the surface of the soft magnetic layer 306 is lower than the surface of the TEOS layer 304 as shown in FIG. 11B. The soft magnetic layer 306 left on the metal layer 300 will become the portion $25c_2$ shown in FIG. 7B.

Figure 12A:
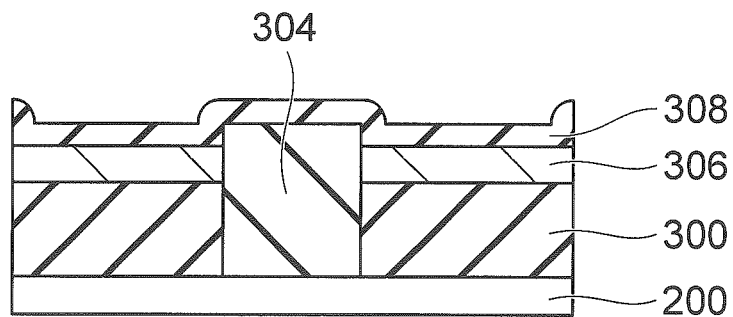
Figure 12B:
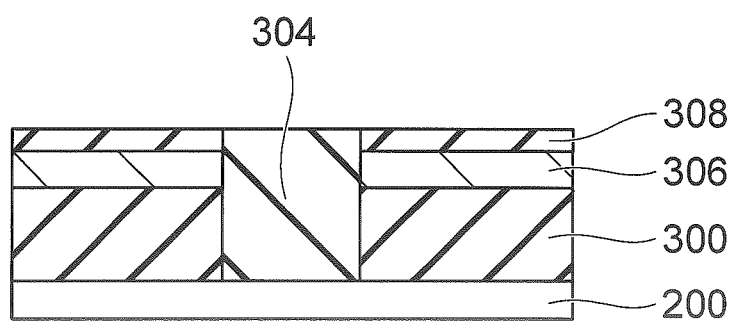

Thereafter, an insulating layer 308 of silicon nitride, for example, is deposited on the soft magnetic layer 306 and the TEOS layer 304 as shown in FIG. 12A. The insulating layer 308 is then flattened by CMP so that the surface of the TEOS layer 304 is exposed (FIG. 12B).

Figure 13A:
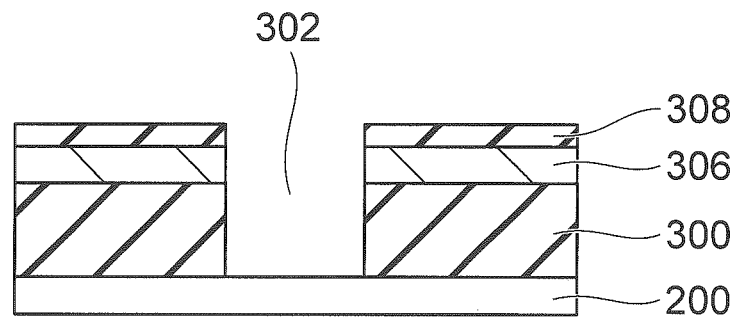
Figure 13B:
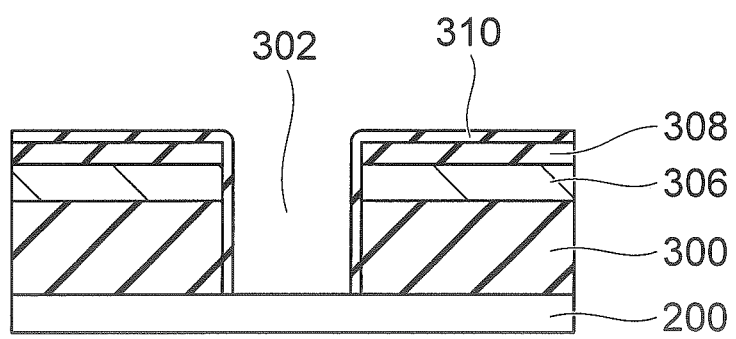

Subsequently, the TEOS layer 304 is removed so that the hole 302 is exposed as shown in FIG. 13A. Thereafter, an insulating layer 310 of aluminum oxide, for example, is formed on the top face of the soft magnetic layer 306 and the side face of the holes 302 (FIG. 13B).

Figure 14A:
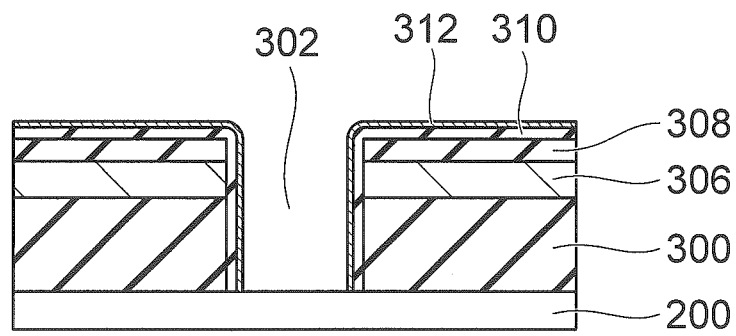
Figure 14B:
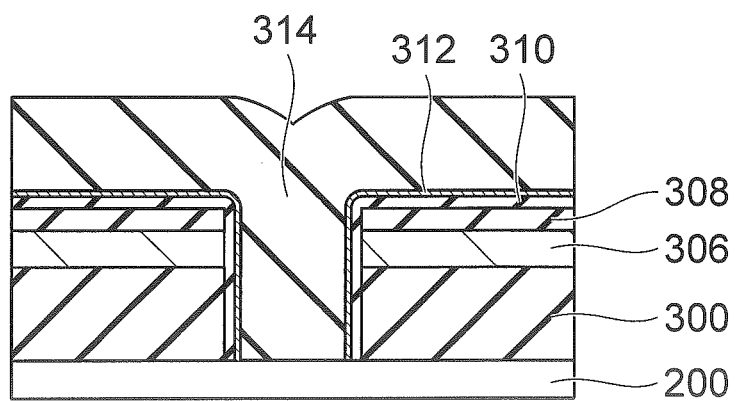

Next, as shown in FIG. 14A, a magnetic material layer 312 to become the magnetic member $ML_{ij}$ (i, j=1, . . . , 4) shown in FIG. 1B is formed on the insulating layer 310 and on the side surface of the hole 302. The magnetic material layer 312 may be a multilayer film having a W (tungsten)/CoFeB/MgO structure. If the side surface of the hole 302 has recessed portions 302a and projected portions 302b as shown in FIG. 8B, the magnetic material layer 312 formed on the side surface of the hole 302 also has recessed portions and projected portions. It is highly possible that domain walls moving in the magnetic member may stop at the regions including the projected portions. Thereafter, a TEOS layer 314 is formed on the magnetic material layer 312 to fill into the hole 302, as shown in FIG. 14B.

Figure 15A:
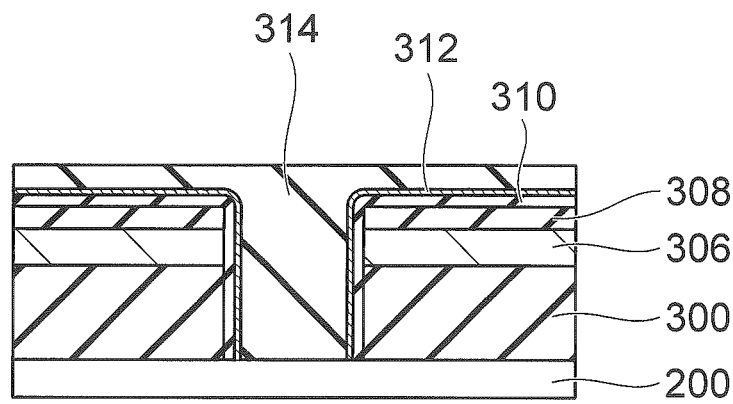
Figure 15B:
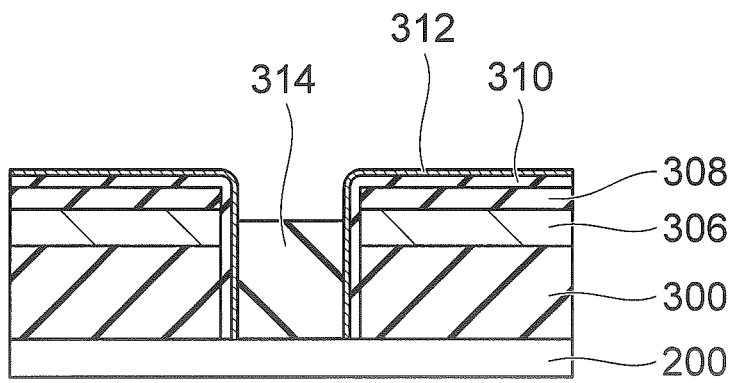

The TEOS layer 314 is then flattened by CMP as shown in FIG. 15A so that the TEOS layer 314 is left on the magnetic material layer 312. Subsequently, the TEOS layer 314 is etched so that the surface of the magnetic material layer 312 is exposed, as shown in FIG. 15B. The etching is performed such that the top surface of the TEOS layer 314 is lower than the top surface of the soft magnetic layer 306 and higher than the lower surface of the soft magnetic layer 306.

Figure 16A:
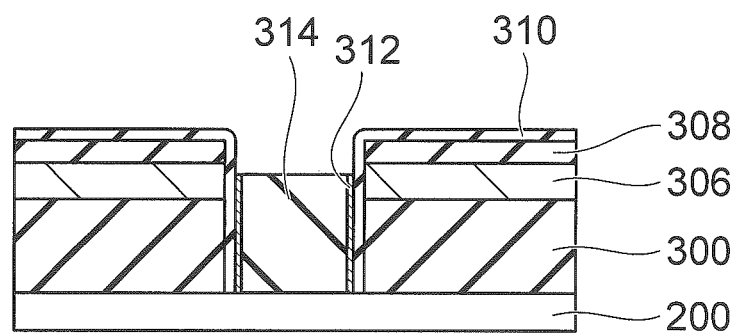
Figure 16B:
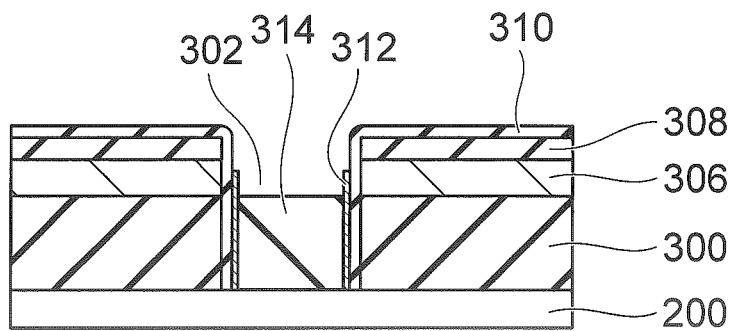

Thereafter, the exposed magnetic material layer 312 is etched by ion beam etching (IBE) so that the surface of the insulating layer 310 is exposed, as shown in FIG. 16A. Subsequently, the TEOS layer 314 is etched so that the top surface of the TEOS layer 314 is lower than the top face of the magnetic material layer 312 in the hole 302, as shown in FIG. 16B.

Figure 17A:
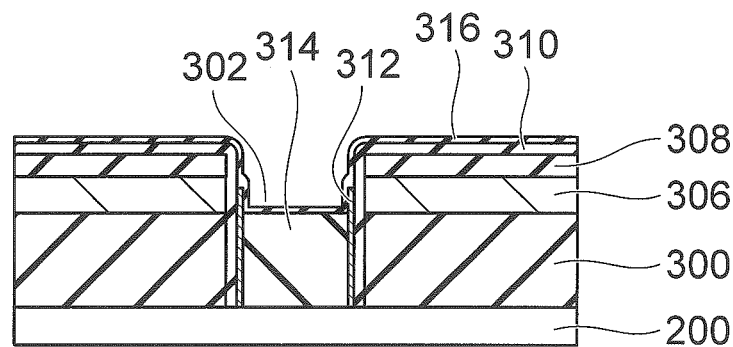
Figure 17B:
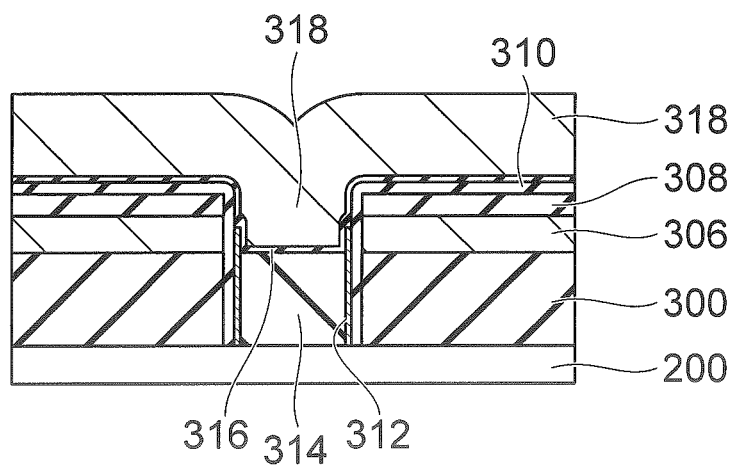

A TiN layer 316 is then formed on the entire surface by chemical vapor deposition (CVD), as shown in FIG. 17A. A soft magnetic layer 318 of NiFe, for example, is deposited on the TiN layer 316 by sputtering, for example, as shown in FIG. 17B.

Figure 18A:
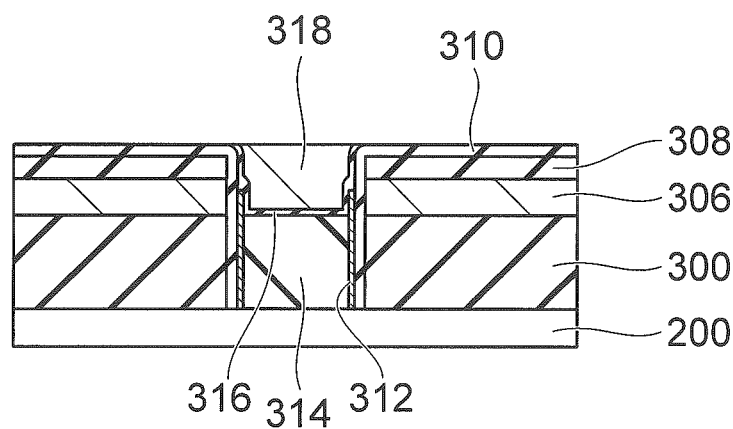
Figure 18B:
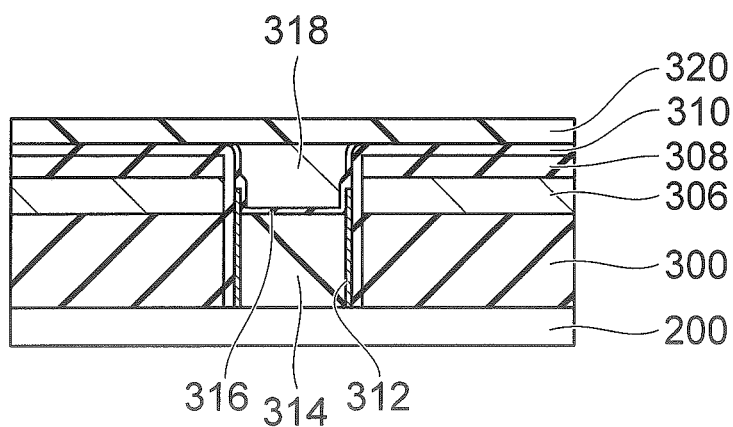

The soft magnetic layer 318 is flattened by CMP so that the surface of the insulating layer 310 is exposed, as shown in FIG. 18A. The soft magnetic layer 318 left on the TEOS layer 314 will become the portion $25c_1$ of the second portion $25c$ in the yoke 25 shown in FIG. 7B. Thereafter, an insulating layer 320 of TEOS, for example, is formed on the entire surface as shown in FIG. 18B.

Figure 19A:
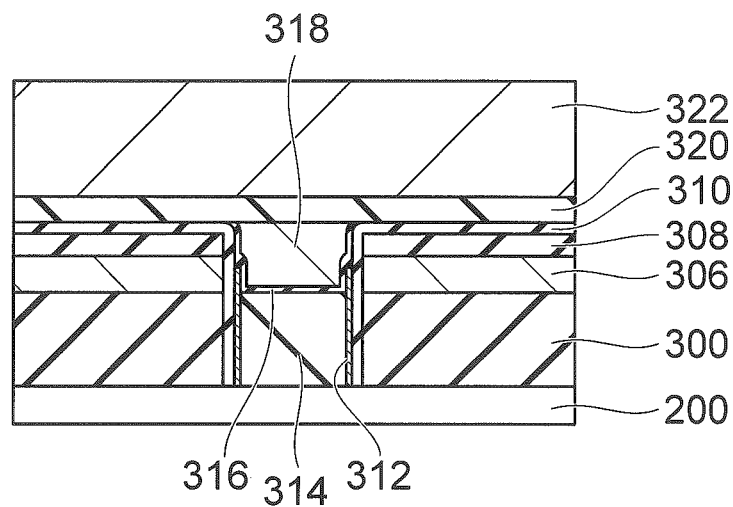
Figure 19B:
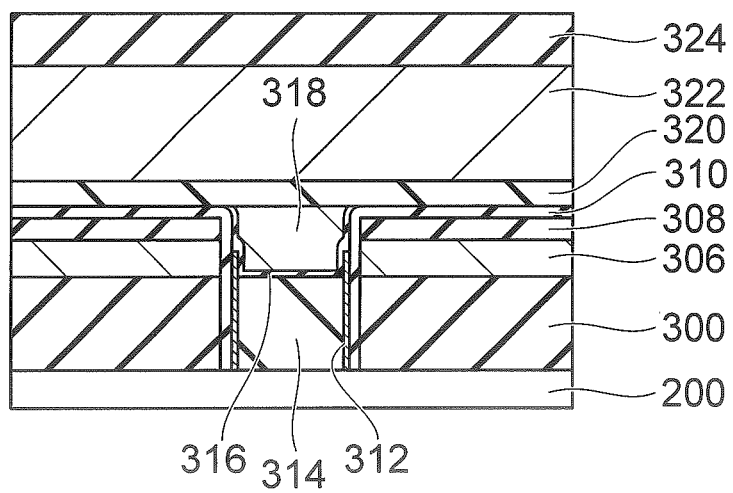

Subsequently, a metal layer 322 of tungsten (W), for example, is formed on the insulating layer 320 as shown in FIG. 19A. The metal layer 322 will be patterned later to become field lines. An insulating layer 324 of silicon nitride, for example, is then formed on the metal layer 322 as shown in FIG. 19B. The insulating layer 324 will become the insulating layer disposed between the field lines $FL_j$ and $F_{j+1}$ and the first portion 25a of the yoke 25 shown in FIG. 7B.

Figure 20A:
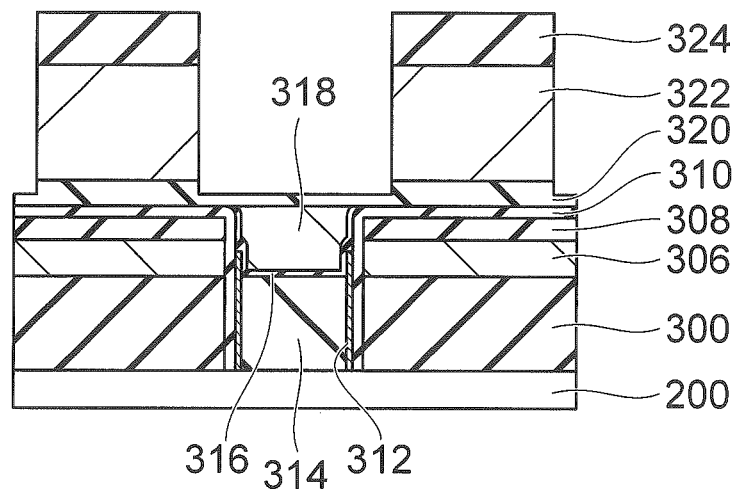
Figure 20B:
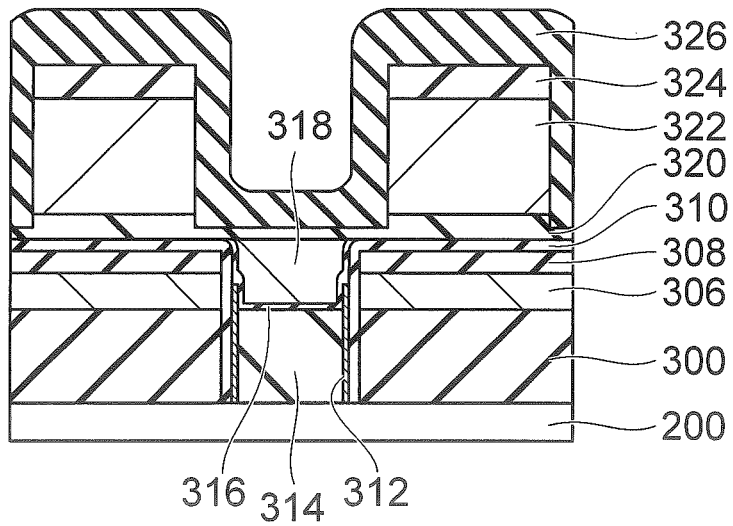

Thereafter, the insulating layer 324 and the metal layer 322 are patterned to have a shape of the field lines as shown in FIG. 20A. As mentioned above, FIG. 20A is a cross sectional view taken along line B-B shown in FIG. 1A. Therefore, as shown in FIG. 1A, the patterned metal layer 322 forms the field lines that make an angle with a direction that is perpendicular to the cross section shown in FIG. 20A. The insulating layer 320 on the soft magnetic layer 318 is etched to be lower than the interface between the insulating layer 320 and the metal layer 322 (FIG. 20A). Subsequently, as shown in FIG. 20B, an insulating layer 326 of silicon nitride, for example, is formed to cover the top surface and the side surface of each of the patterned insulating layer 324 and metal layer 322.

Figure 21A:
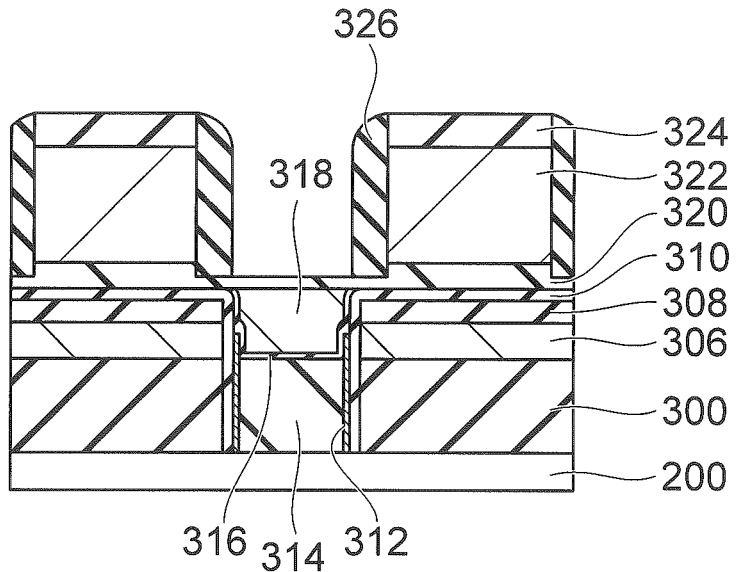
Figure 21B:
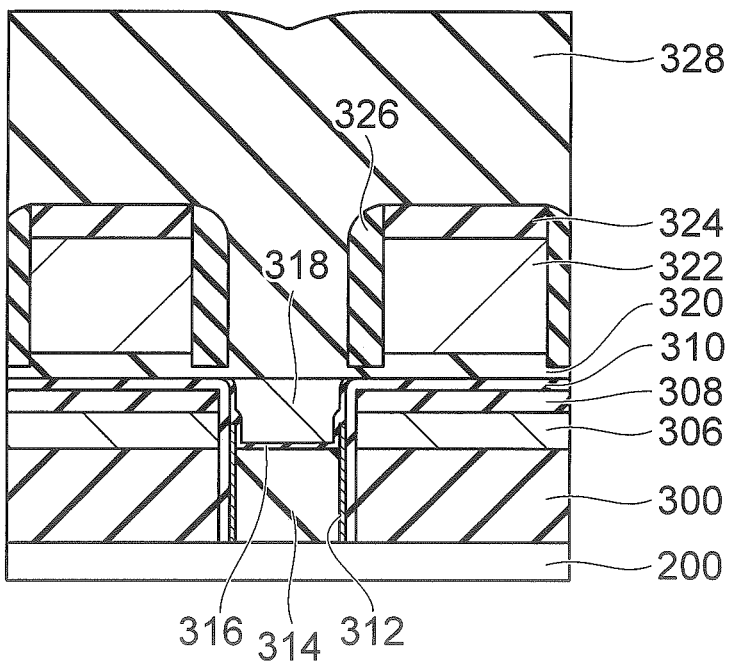

Thereafter, as shown in FIG. 21A, the insulating layer 326 is etched by reactive ion etching (RIE) to remove the insulating layer 326 above the soft magnetic layer 318. As a result, the top surface of the insulating layer 320 on the soft magnetic layer 318 is exposed, and the insulating layer 326 is left on the side surfaces of the metal layer 322 and the insulating layer 324. An insulating film 328 of TEOS, for example, is then formed on the entire surface as shown in FIG. 21B.

Figure 22A:
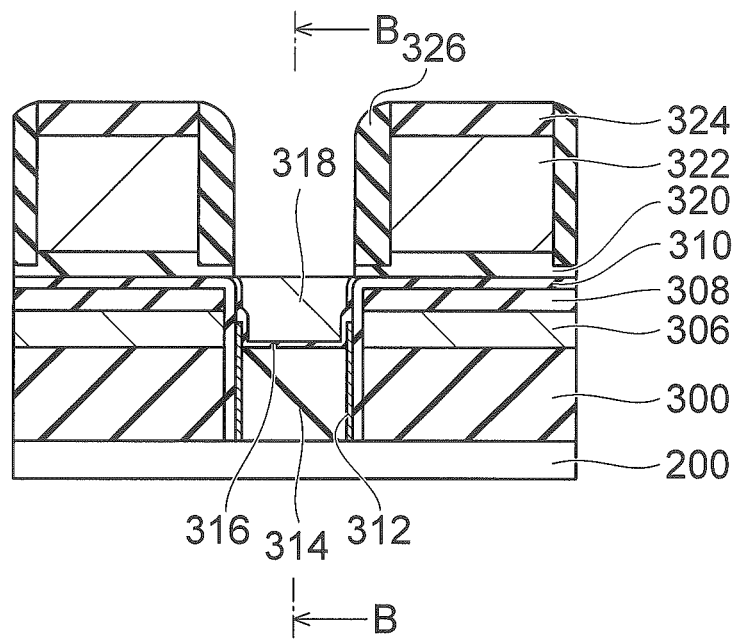
Figure 22B:
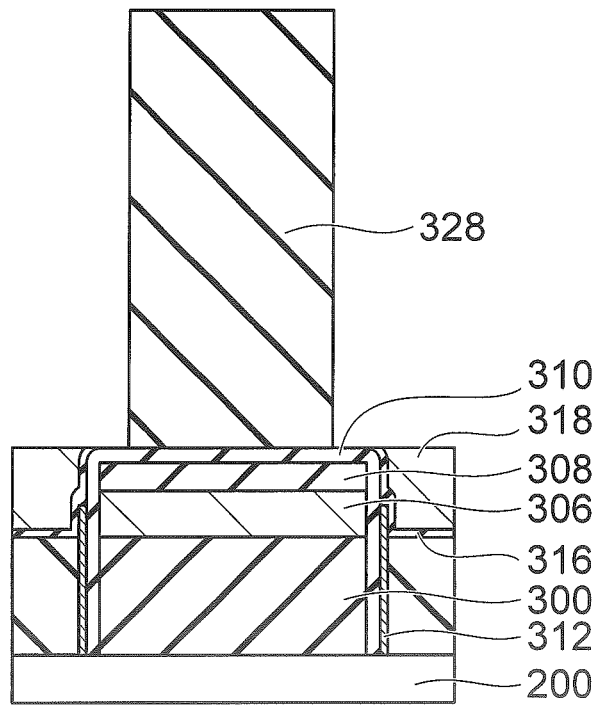

Subsequently, the insulating film 328 is patterned as shown in FIGS. 22A and 22B. FIG. 22B is a cross sectional view cut along plane B-B shown in FIG. 22A. The patterned insulating film 328 electrically isolates adjacent bit lines, which will be formed in a process performed later. As a result of the patterning, the insulating film 328 above the TEOS layer 314 is removed so that the top surface of the soft magnetic layer 318 on the TEOS layer 314 is exposed.

Figure 23A:
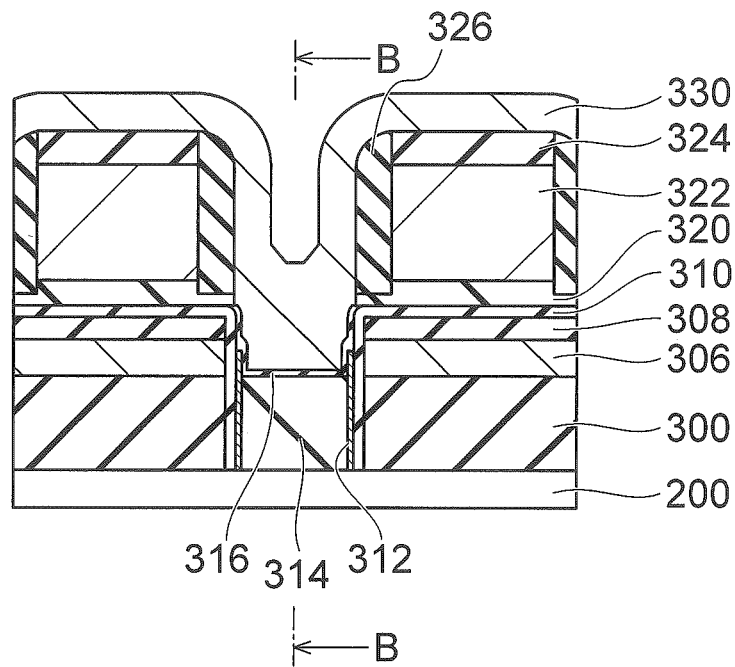
Figure 23B:
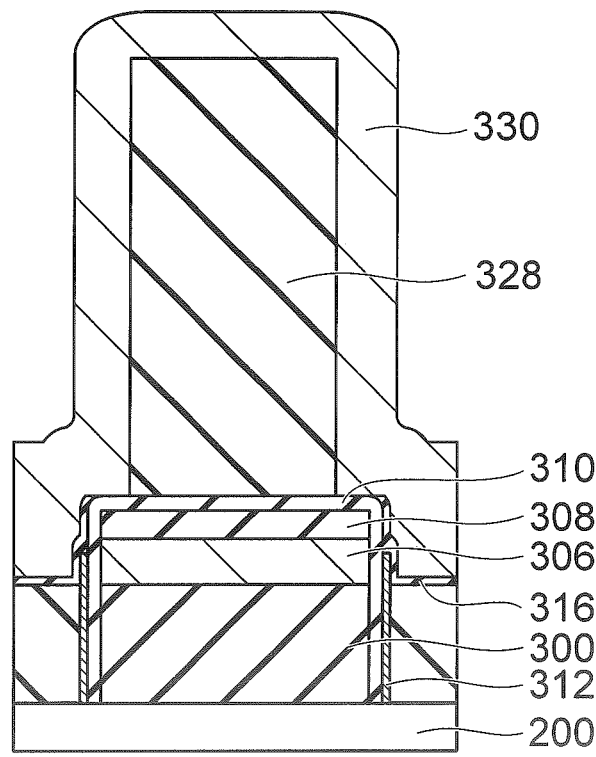

Thereafter, a soft magnetic layer 330 of NiFe, for example, is deposited by sputtering on the entire surface as shown in FIGS. 23A and 23B. FIG. 23B is a cross sectional view cut along plane B-B shown in FIG. 23A. The soft magnetic layer 330 will become the first portion 25a and the third portion 23b of the yoke 25 shown in FIG. 7B. The soft magnetic layer 330 disposed above the metal layer 322 will become the first portion 25a, and the soft magnetic layer 330 disposed along the side surface of the metal layer 322 will become the third portion 25b. The connection portion of the second portion and the third portion in the yoke formed by the manufacturing method according to the third embodiment has an inverted T shape.

Figure 24A:
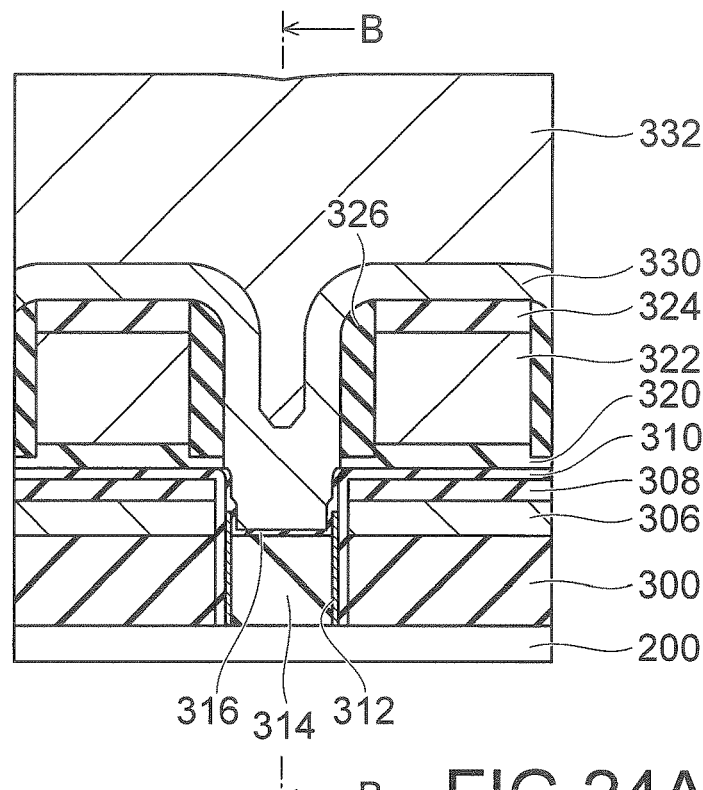
Figure 24B:
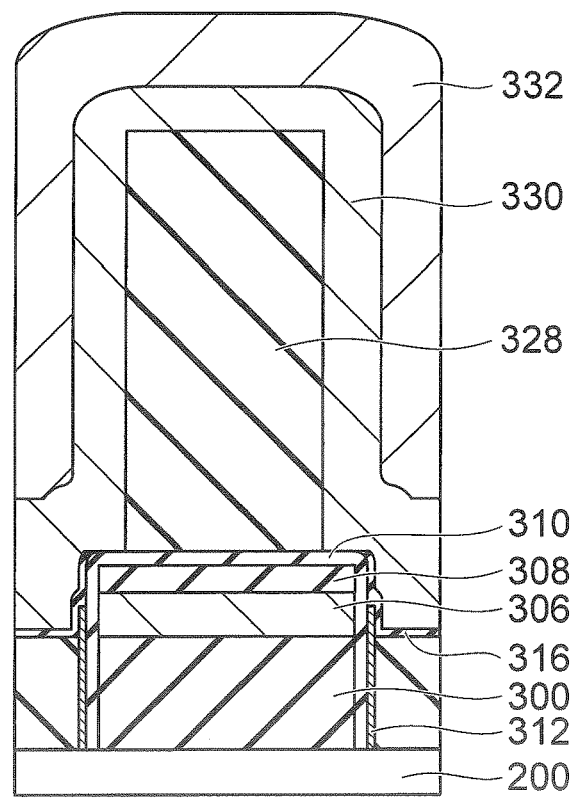

A wiring material film 332 of a low resistance material, such as tungsten (W), is then deposited by sputtering to fill into a recessed portion above the TEOS layer 314 (see FIG. 23A) as shown in FIGS. 24A and 24B. FIG. 24B is a cross sectional view taken along plane B-B in FIG. 24A.

Figure 25A:
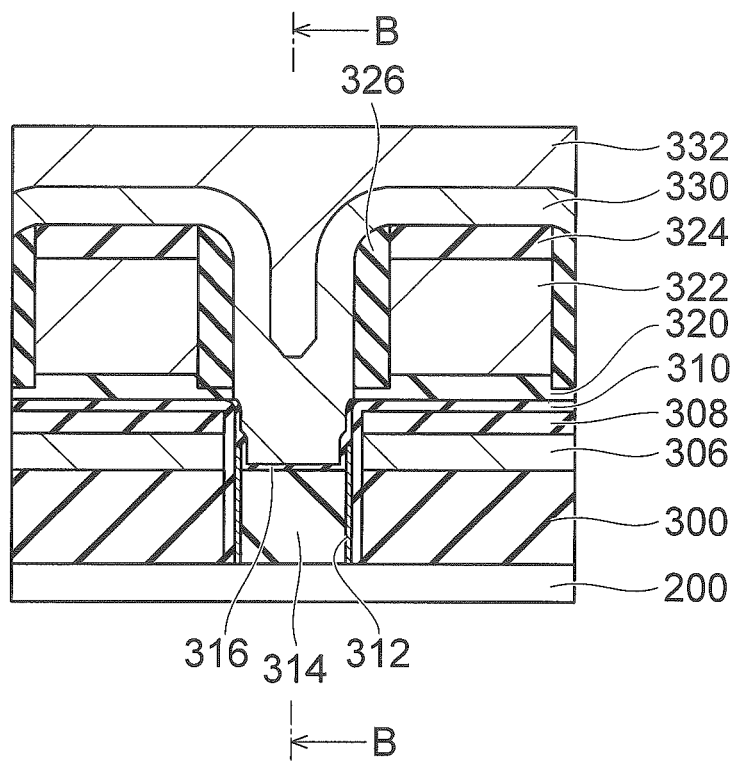
Figure 25B:
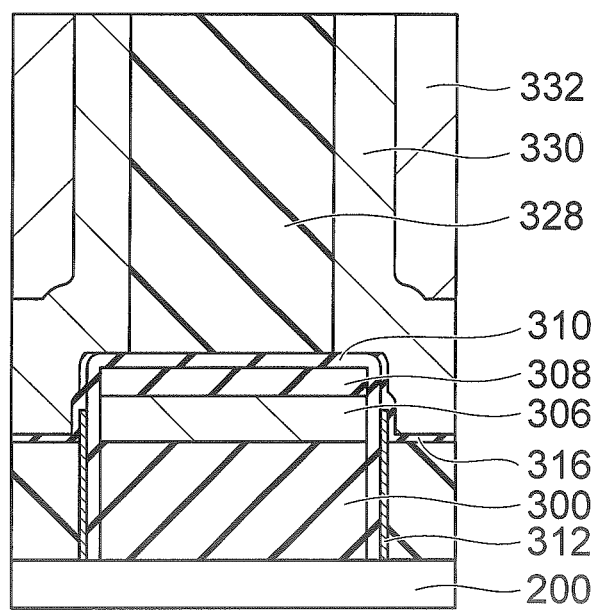

Next, as shown in FIGS. 25A and 25B, the wiring material film 332 is flattened by CMP so that the top surface of the insulating film 328 is exposed. The flattened wiring material film 332 will become adjacent wirings (bit lines) 332 isolated by the insulating film 328. FIG. 25B is a cross sectional view cut along plane B-B in FIG. 25A.

Figure 26:
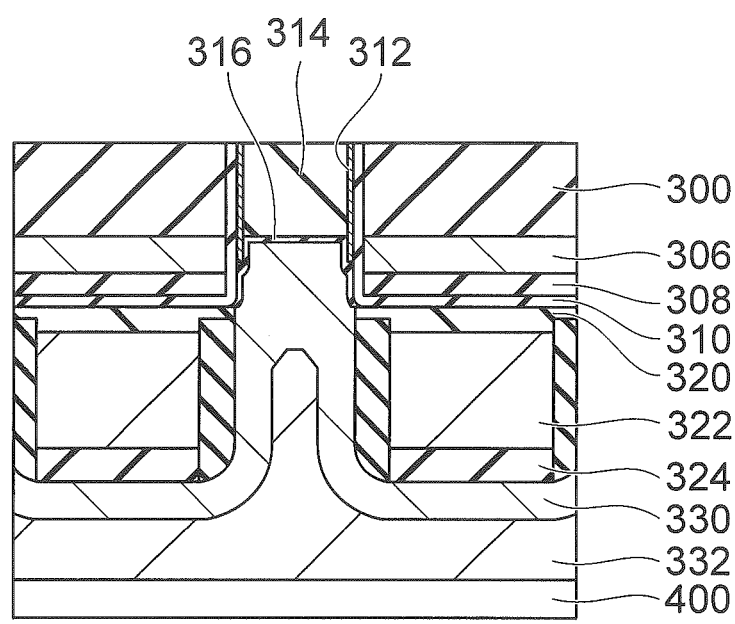

Thereafter, a CMOS circuit including the control circuit 100 and other components shown in FIG. 1A is formed on a substrate 400, and the substrate 400 is turned over and joined to the flattened surface of the silicon substrate 200 on which the wiring 332 and other elements shown in FIG. 25A are formed. The surface on which the CMOS circuit is formed of the substrate 400 and the surface on which the wiring 332 is formed of the silicon substrate 200 are joined together (FIG. 26).

Next, the silicon substrate 200 is polished from the back side by CMP, for example, so that the surface of the aluminum oxide layer 300 is exposed. At the same time, an end portion of the magnetic material layer 312 to become the magnetic member $ML_{ij}$ (i, j=1, . . . , 4) is also exposed. Thereafter, a nonmagnetic conductive layer $12_{ij}$ (i, j=1, . . . , 4) shown in FIG. 1B is formed to electrically connect to the end portion of the magnetic material layer 312 exposed at the surface of the aluminum oxide layer 300, which is also exposed. Subsequently, a magnetoresistive element $14_{ij}$ (i, j=1, . . . , 4), a nonmagnetic conductive layer $16_{ij}$ (i, j=1, . . . , 4), a switching portion $18_{ij}$ (i, j=1, . . . , 4), and a source line $SL_j$ (j=1, . . . , 4) are formed to connect to the nonmagnetic conductive layer $12_{ij}$ (i, j=1, . . . , 4), thereby completing the magnetic memory. The source line $SL_j$ (j=1, . . . , 4) is electrically connected through a via formed in the minute hole in the aluminum oxide 300 (for example, the hole 302 shown in FIGS. 8A and 8B). The hole, in which the via is formed, does not have the magnetic material layer 312 therein in the process shown in FIG. 14A. However, a magnetic material layer may be formed in the hole in which the via is formed. The magnetic material layer will become a dummy magnetic material layer.

The magnetic memory manufactured by the method according to the third embodiment is the magnetic memory according to the second embodiment shown in FIGS. 7A and 7B, and is capable of preventing data from being fixed to an end of the magnetic member and the write efficiency from being reduced, like the magnetic memory according to the first embodiment.

The first portion of the yoke 25 disposed above adjacent field lines in the magnetic memory manufactured by the method according to the third embodiment has a recess 25d shown in FIG. 5 or FIG. 6, unlike the case shown in FIG. 7B (see FIG. 25A). Therefore, unlike the case shown in FIG. 7B, magnetic lines of flux may smoothly flow from adjacent first portions 25a to the third portion 25b located therebetween, and smoothly branch from the third portion 25b into adjacent first portions 25a. As a result, it is possible to prevent the writing magnetic field from decreasing.

(First Modification)

A method of manufacturing a magnetic memory according to a first modification of the third embodiment will be described with reference to FIGS. 27A to 35. In the yoke of the magnetic memory manufactured by the method according to the third embodiment, the connection portion between the second portion and the third portion has an inverted T shape, which is smoother than that manufactured according to the third embodiment. Other than the shape of the connection portion between the second portion and the third portion, the magnetic memory manufactured according to the first modification has the same structure as the magnetic memory manufactured according to the third embodiment.

Figure 27A:
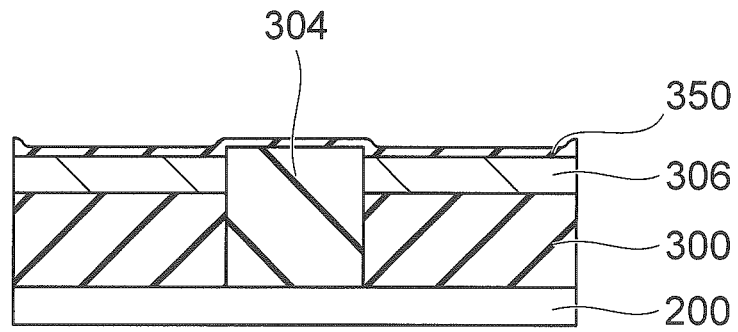
FIGS. 27A to 35 are cross sectional views illustrating processes of a manufacturing method according to a first modification of the third embodiment.
Figure 27B:
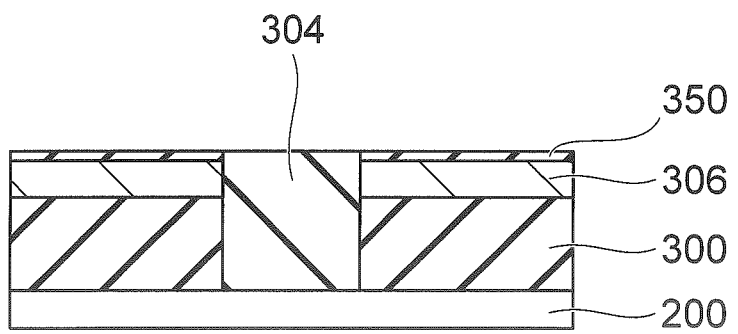

The processes of the manufacturing method are the same as those of the third embodiment from FIG. 8A to FIG. 11B. Subsequently, as shown in FIG. 27A, an insulating layer 350 of hafnium oxide, for example, is deposited on the soft magnetic layer 306 and the TEOS layer 304. The insulating layer 350 is then flattened by CMP as shown in FIG. 27B. At this time, the surface of the TEOS layer 304 is exposed.

Figure 28A:
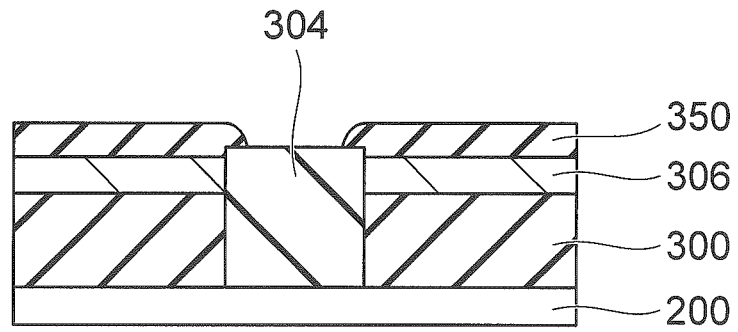
Figure 28B:
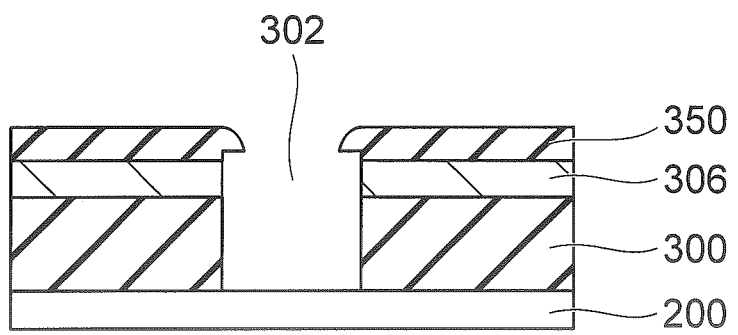

Thereafter, hafnium oxide is selectively deposited by atomic layer deposition (ALD), for example, as shown in FIG. 28A. As a result, the insulating layer 350 of hafnium oxide on the soft magnetic layer 306 is made thicker. The hafnium oxide is also deposited on a portion of the TEOS layer 304. Subsequently, the TEOS layer 304 is removed so that the hole 302 is exposed, as shown in FIG. 28B. A portion of the insulating layer 350 is left over the hole 302.

Figure 29A:
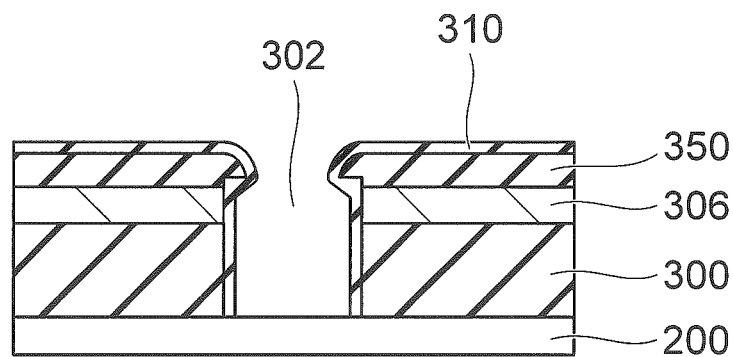
Figure 29B:
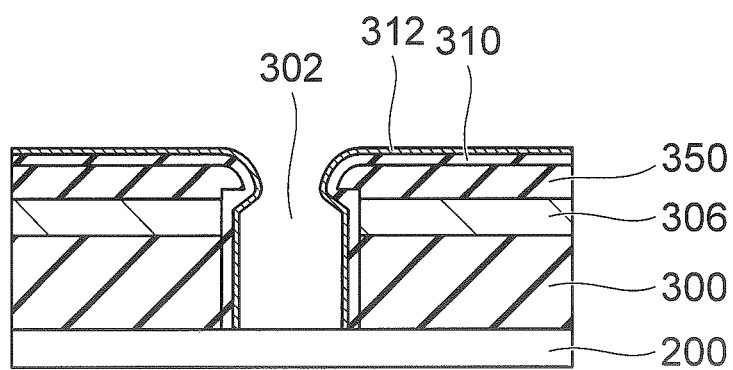

An insulating layer 310 of aluminum oxide, for example, is then formed on the top surface and the side surface of the insulating layer 350 and the side surface of the hole 302, as shown in FIG. 29A. Subsequently, a magnetic material layer 312 to become the magnetic member $ML_{ij}$ (i, j=1, . . . , 4) shown in FIG. 1B is deposited on the top surface and the side surface of the insulating layer 310 and the side surface of the hole 302, as shown in FIG. 29B. The magnetic material layer 312 may be a multilayer film having such a structure as W (tungsten)/CoFeB/MgO, for example.

Figure 30A:
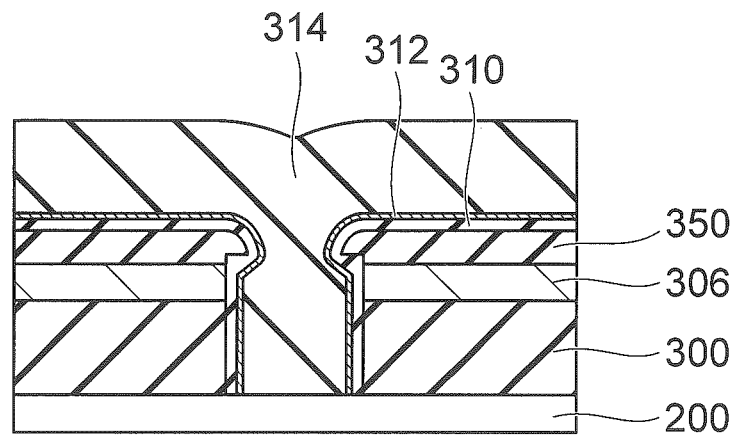
Figure 30B:
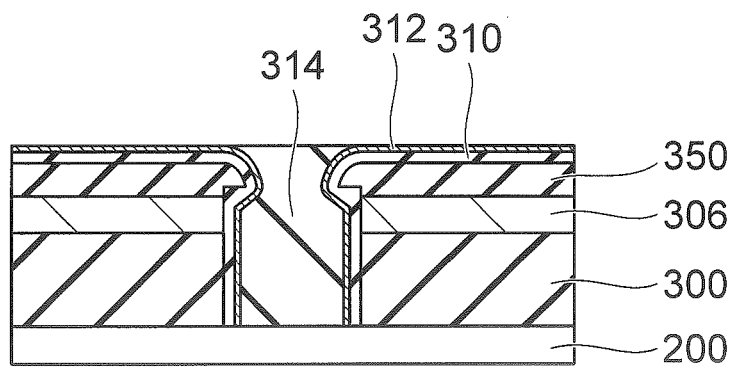

Thereafter, a TEOS layer 314 is formed on the magnetic material layer 312 to fill into the hole 302, as shown in FIG. 30A. The TEOS layer 314 is then flattened by CMP so that the top surface of the magnetic material layer 312 is exposed, as shown in FIG. 30B. The top surface of the TEOS layer filled into the hole is also exposed at this time.

Figure 31A:
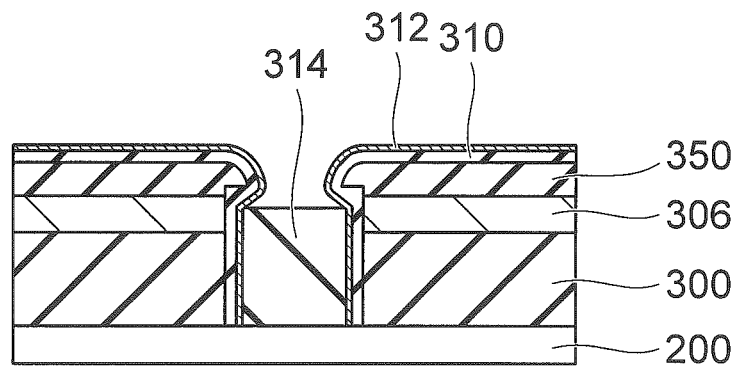
Figure 31B:
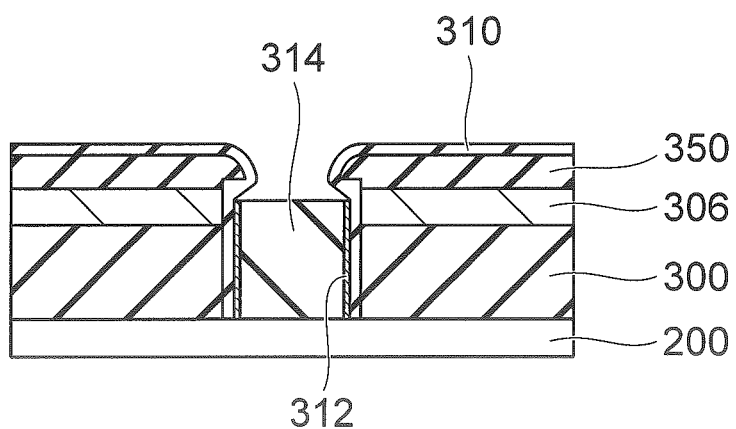

The TEOS layer 314 is then etched so that the top surface of the TEOS layer 314 is lower than the top surface of the exposed magnetic material layer 312, as shown in FIG. 31A. Subsequently, the magnetic material layer 312 is etched by IBE, for example, so that the insulating layer 310 is exposed, as shown in FIG. 31B.

Figure 32A:
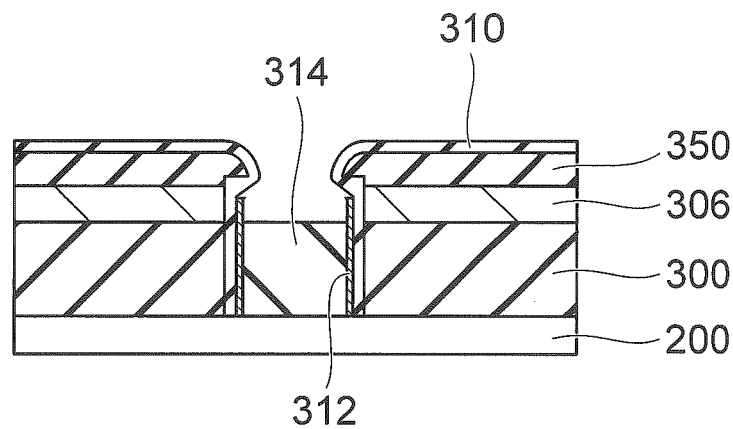
Figure 31B:
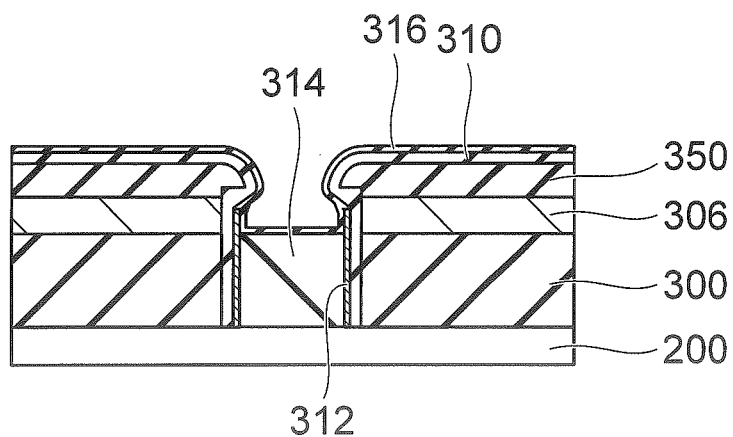

The TEOS layer 314 is then etched so that the top surface of the TEOS layer 314 is lower than the top face of the magnetic material layer 312 in the hole 302, as shown in FIG. 32A. Thereafter, a TiN layer 316 is formed by CVD, for example, on the entire surface as shown in FIG. 32B.

Figure 33A:
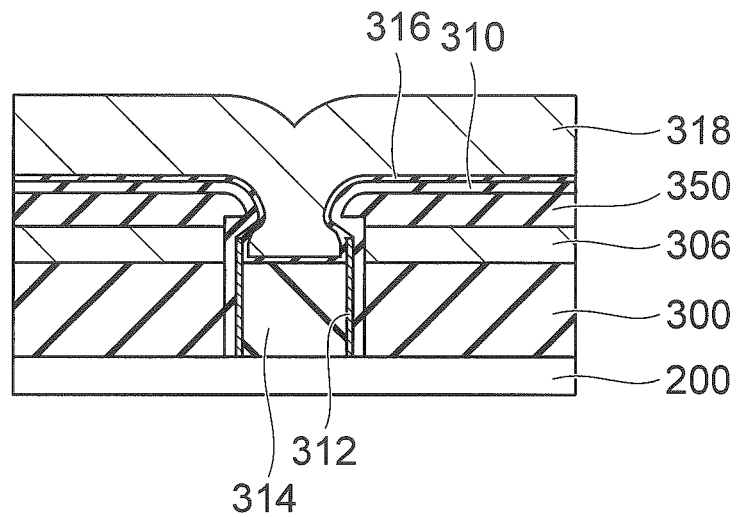
Figure 33B:
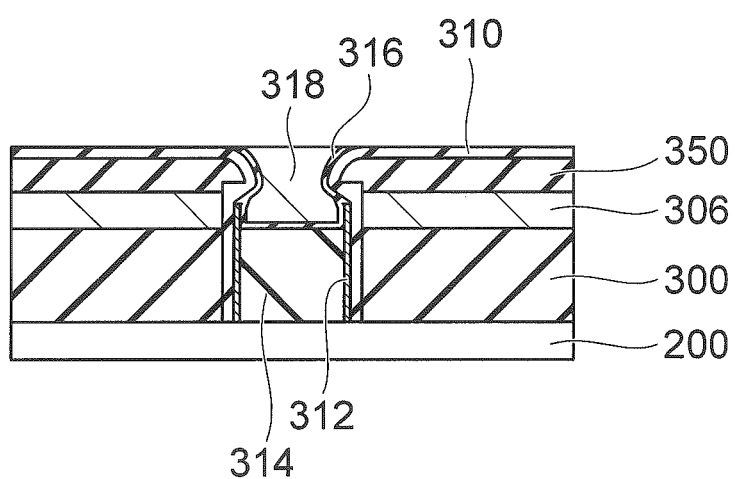

Next, as shown in FIG. 33A, a soft magnetic layer 318 of NiFe, for example, is deposited by sputtering, for example, on the TiN layer 316. The soft magnetic layer 318 is then flattened by CMP, for example, so that the top surface of the insulating layer 310 is exposed as shown in FIG. 33B. The soft magnetic layer 318 left on the TEOS layer 314 at this time will become the portion $25c_1$ of the second portion of the yoke 25 shown in FIG. 7B. The portion $25c_1$ of the first modification has a more smooth shape as compared to that of the third embodiment.

Figure 34A:
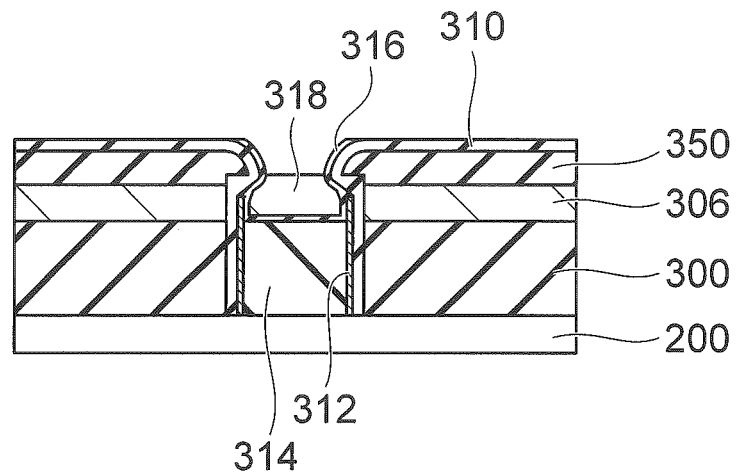
Figure 34B:
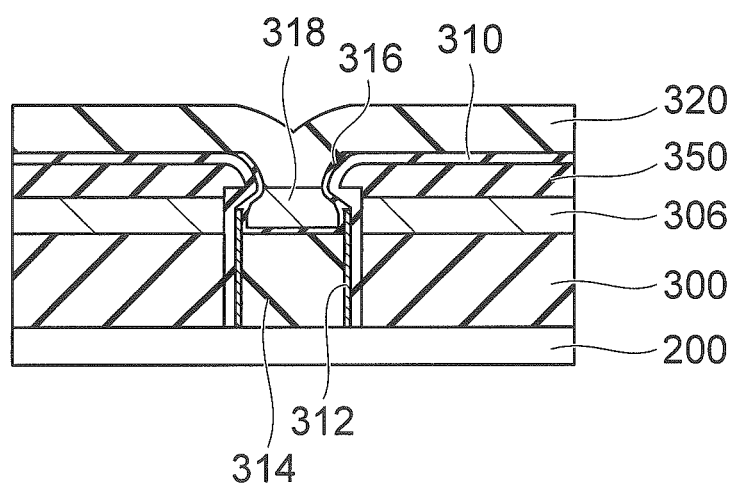

The soft magnetic layer 318 is the etched so that the top surface of the soft magnetic layer 318 is lower than the top surface of the insulating layer 310 as shown in FIG. 34A. Thereafter, an insulating film 320 of TEOS is formed on the entire surface, as shown in FIG. 34B. The insulating film 320 is then flattened.

Figure 35:
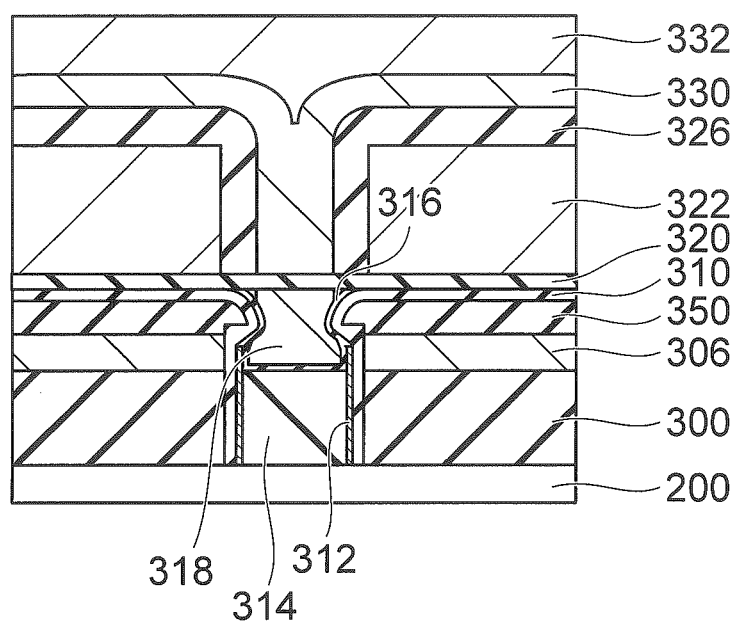

Thereafter, the processes shown in FIGS. 19A to 25A of the third embodiment are performed. As the result, the structure shown in FIG. 35 is obtained. Subsequently, the process shown in FIG. 26 is performed to obtain the magnetic memory manufactured by the method according to the first modification.

As described above, the magnetic memory manufactured by the method according to the first modification of the third embodiment is capable of preventing data from being fixed to an end of the magnetic member and the write efficiency from being reduced, like the magnetic memory manufactured by the method according to the third embodiment. The magnetic memory manufactured by the method according to the first modification has the yoke in which the connection portion between the second portion and the third portion has a more rounded shape than that of the third embodiment. Therefore, the magnetic memory manufactured by the method according to the first modification may prevent a reduction in writing magnetic field more than the magnetic memory manufactured according to the third embodiment.
(Second Modification)

A method of manufacturing a magnetic memory according to a second modification of the third embodiment will be described with reference to FIGS. 36A to 40. The method according to the second modification is for manufacturing the magnetic memory according to the modification of the first embodiment shown in FIG. 6.

Figure 36A:
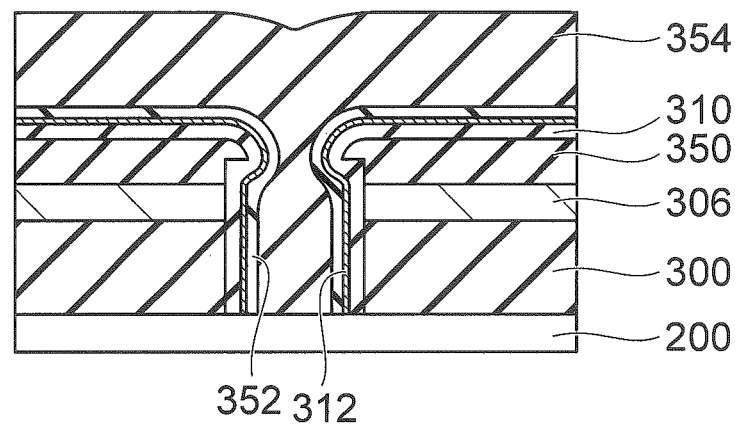
FIGS. 36A to 40 are cross sectional views illustrating processes of a manufacturing method according to a second modification of the third embodiment.

First, the processes of the manufacturing method according to the first modification are performed until the magnetic material layer 312 shown in FIG. 29B is formed. Subsequently, a TEOS layer 352, for example, is formed on the top surface and the side surface of the magnetic material layer 312 and an insulating film 354 of silicon nitride, for example, is formed by CVD, for example, to fill into the hole 302 as shown in FIG. 36A.

Figure 36B:
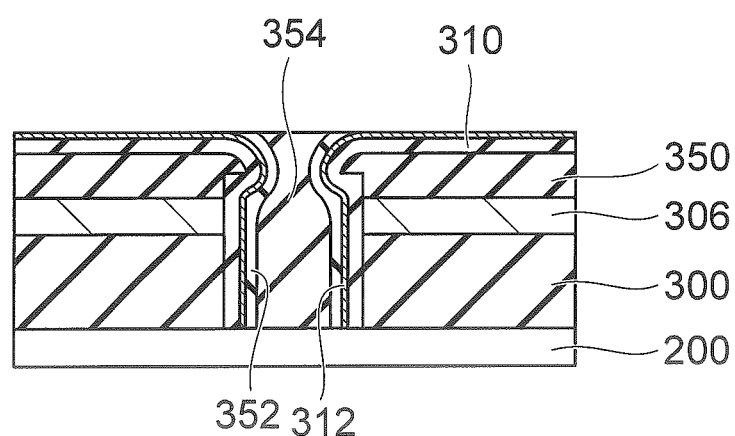
Figure 37A:
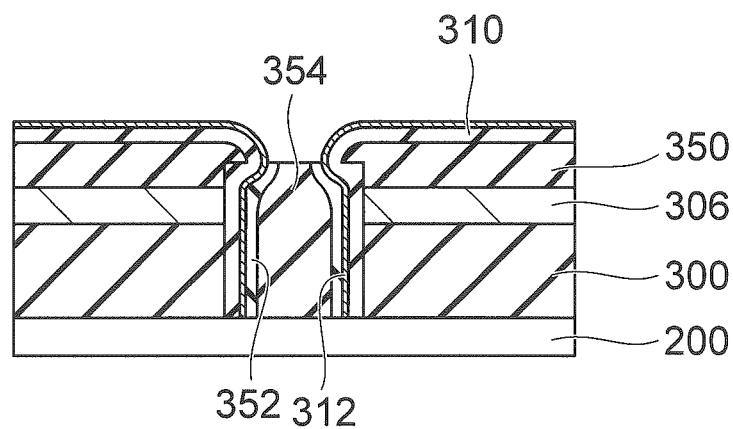

The insulating film 354 is then flattened by CMP, for example, as shown in FIG. 36B. As a result, the surface of the magnetic material layer 312 is exposed. Subsequently, the insulating film 354 and the TEOS layer 352 are etched so that the top surfaces of the insulating film 354 and the TEOS layer 352 are lower than the top surface of the magnetic material layer 312, as shown in FIG. 37A.

Figure 37B:
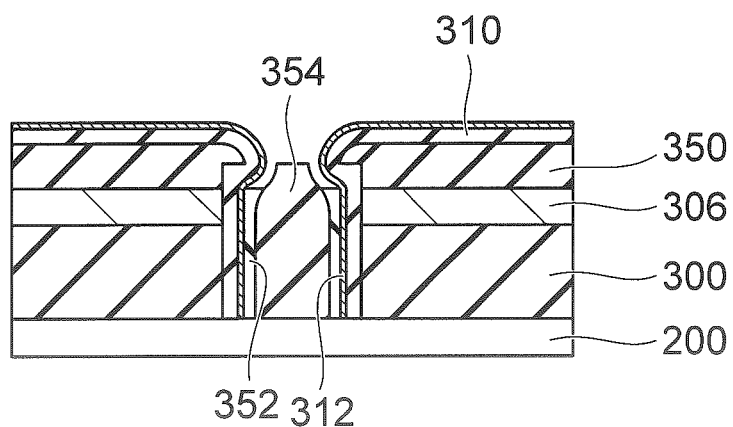
Figure 38A:
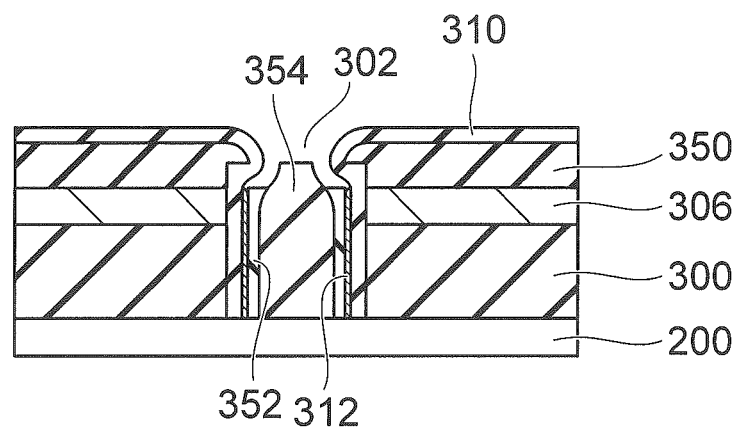

Thereafter, the TEOS layer 352 is selectively etched so that the upper portion of the insulating layer 354 is protruded, as shown in FIG. 37B. The protrusion is used to form the recess 25e of the second portion of the yoke shown in FIG. 6. Subsequently, the magnetic material layer 312 is etched by IBE, for example, as shown in FIG. 38A. As the result, the insulating layer 310 of aluminum oxide is left on the insulating layer 350. The top surface of the magnetic material layer 312 in the hole 302 is equal to or lower than the top surface of the TEOS layer 352.

Figure 38B:
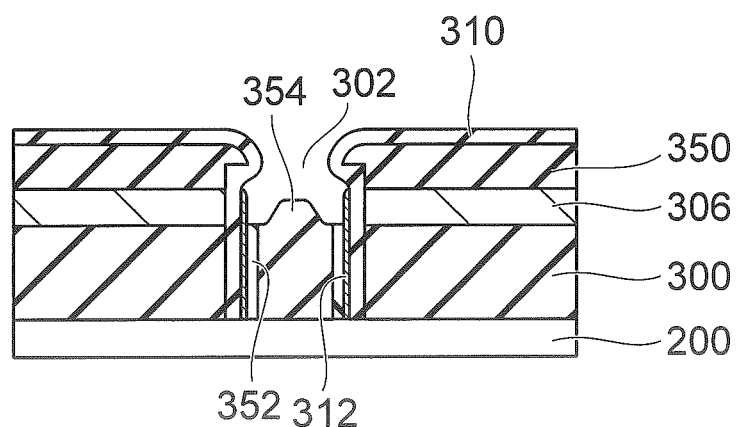
Figure 39:
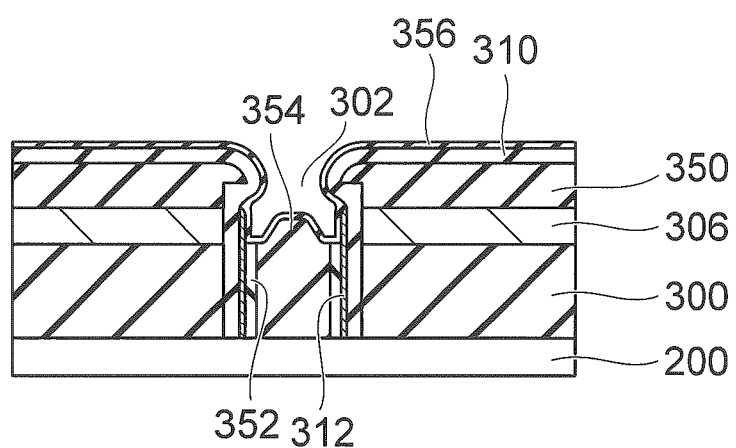

The TEOS layer 352 and the insulating film 354 are then etched so that the top surfaces of the TEOS layer 352 and the insulating film 354 are lower than the top surface of the magnetic material layer 312 in the hole 302, as shown in FIG. 38B. Subsequently, an insulating layer 356 of TiN is formed on the entire surface by CVD, for example, as shown in FIG. 39.

Figure 40:
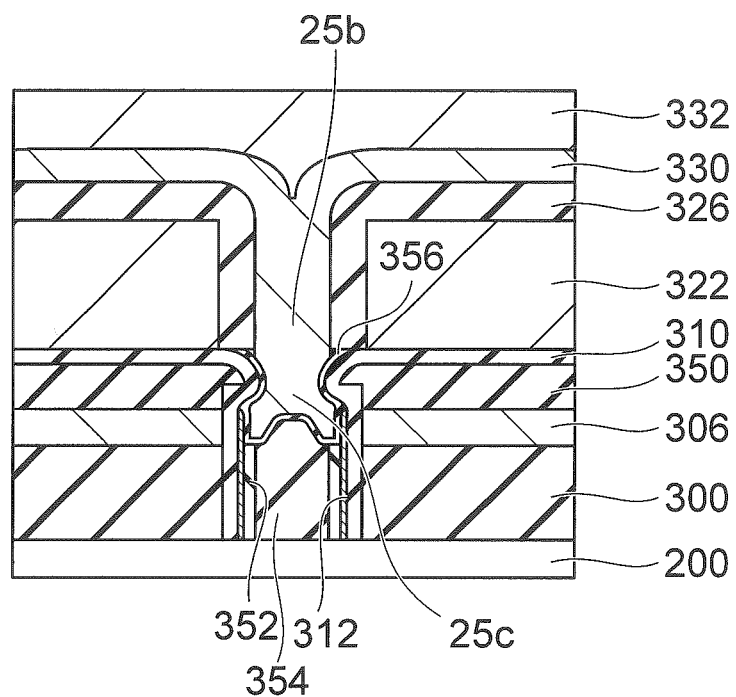

Thereafter, the processes shown in FIGS. 17B to 25A of the third embodiment are performed to obtain the structure shown in FIG. 40. The connection portion between the second portion 25c and the third portion 25b of the yoke has an inverted Y shape. Subsequently, the process shown in FIG. 26 of the third embodiment is performed to obtain the magnetic memory manufactured by the method according to the second modification of the third embodiment.

As described above, the magnetic memory manufactured by the method according to the second modification of the third embodiment is capable of preventing data from being fixed to an end of the magnetic member and the write efficiency from being reduced, like the magnetic memory according to the third embodiment. The magnetic memory manufactured by the method according to the second modification has the yoke in which the connection portion between the second portion and the third portion has an inverted Y shape. Therefore, the magnetic memory manufactured by the method according to the second modification may prevent a reduction in writing magnetic field more than the magnetic memory manufactured according to the third embodiment.

Fourth Embodiment

A method of manufacturing a magnetic memory according to a fourth embodiment will be described with reference to FIGS. 41 to 51B. The manufacturing method according to the fourth embodiment relates to the magnetic memory according to the modification of the first embodiment shown in FIG. 6. The magnetic memory includes yokes separated for respective rows, and the connection portion between the second portion 25c and the third portion 25b of each yoke has an inverted Y shape.

Figure 41A:
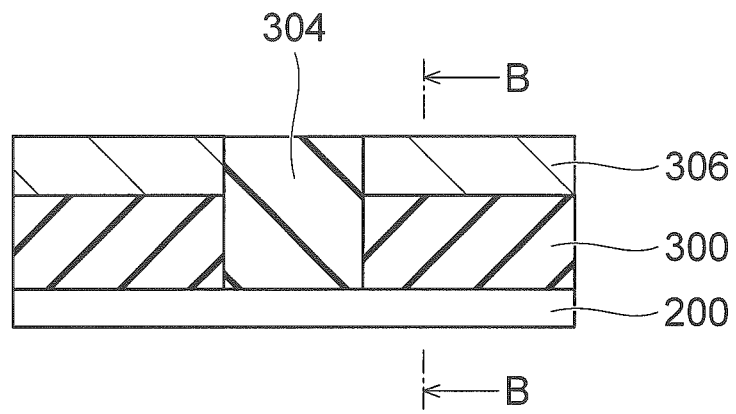
FIGS. 41A to 51B are cross sectional views illustrating processes of a manufacturing method according to a fourth embodiment.
Figure 41B:
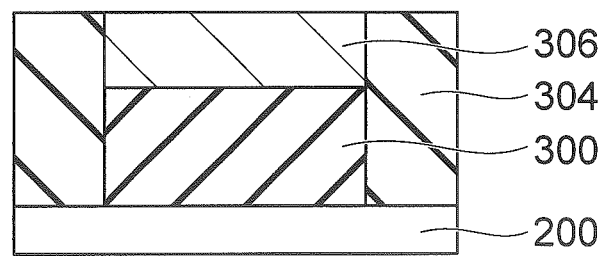
Figure 42A:
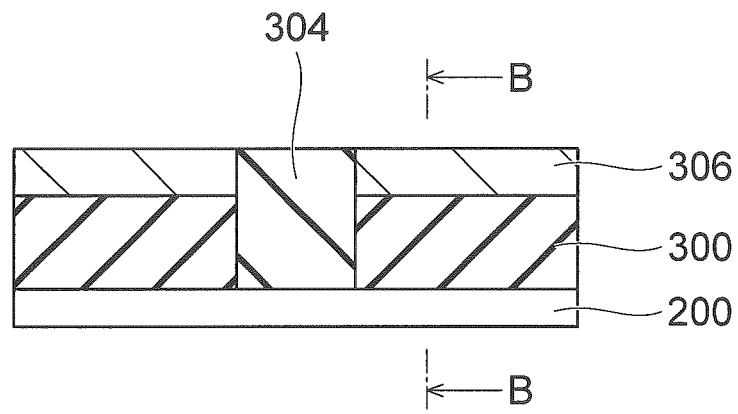
Figure 42B:
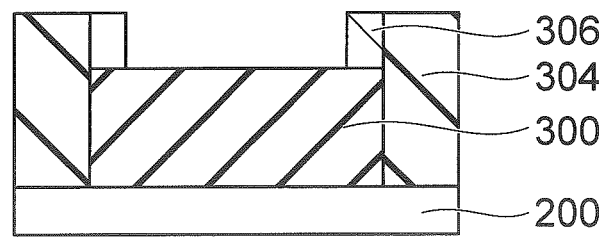

First, the processes of the manufacturing method according to the third embodiment are performed until the process shown in FIG. 11A is completed. FIGS. 41A and 41B are cross sectional views of the workpiece in this state. FIG. 41B is the cross sectional view cut along plane B-B in FIG. 41A. The soft magnetic layer 306 is then patterned as shown in FIGS. 42A and 42B. Specifically, as shown in FIG. 42B, a central portion of the soft magnetic layer 306 is removed to make a space with an adjacent row, and some of the soft magnetic layer 306 is left on the side of the adjacent row. The patterning results in the separation of memory cells disposed in adjacent rows. FIG. 42B is a cross sectional view cut along plane B-B in FIG. 42A.

Figure 43A:
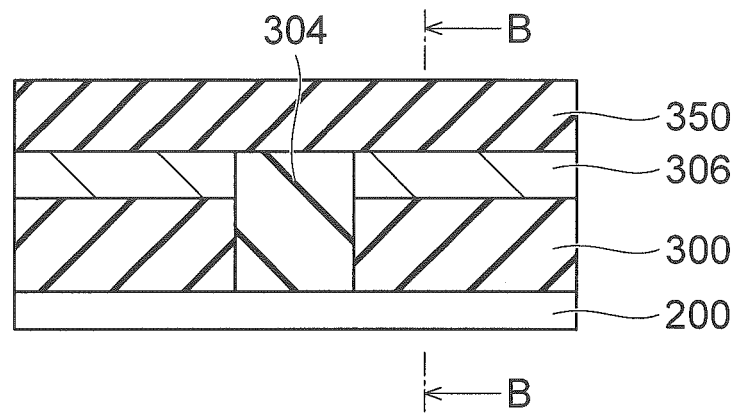
Figure 43B:
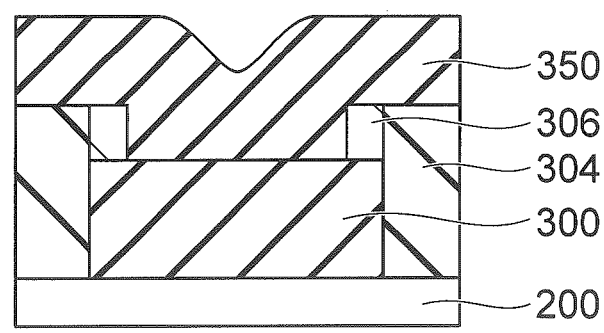
Figure 44A:
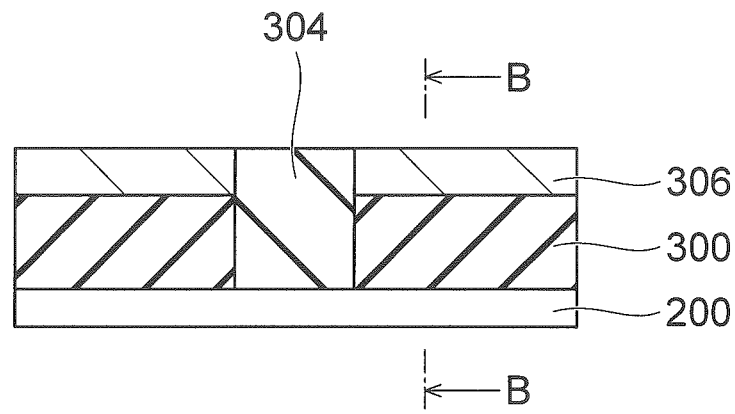
Figure 44B:
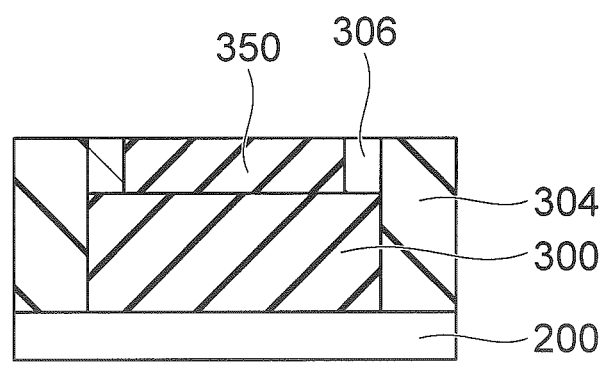

An insulating layer 350 of hafnium oxide, for example, is then deposited on the entire surface as shown in FIGS. 43A and 43B. FIG. 43B is a cross sectional view cut along plane B-B in FIG. 43A. Subsequently, the insulating layer 350 is flattened by CMP so that the top surface of the soft magnetic layer 306 is exposed as shown in FIG. 44A and FIG. 44B. FIG. 44B is a cross sectional view cut along plane B-B in FIG. 44A.

Figure 45A:
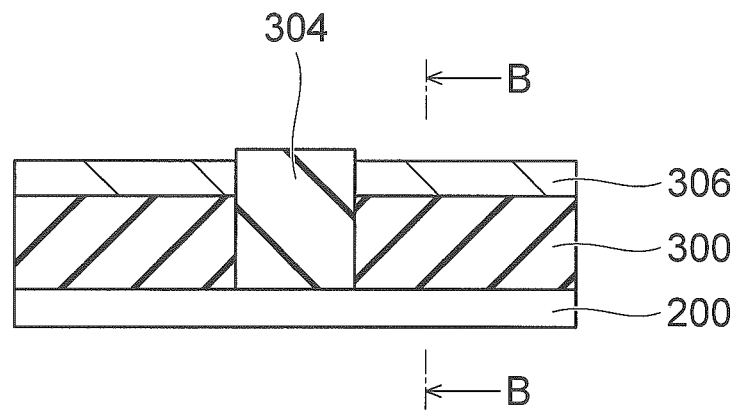
Figure 45B:
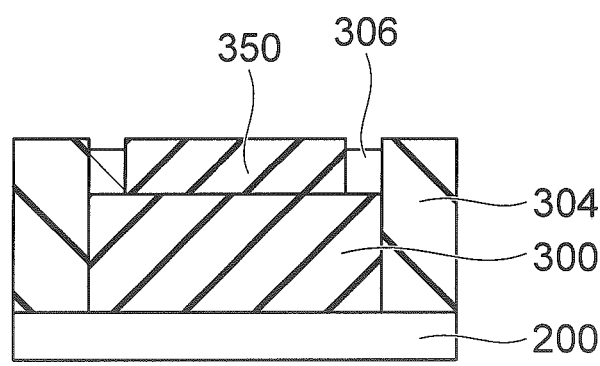
Figure 46A:
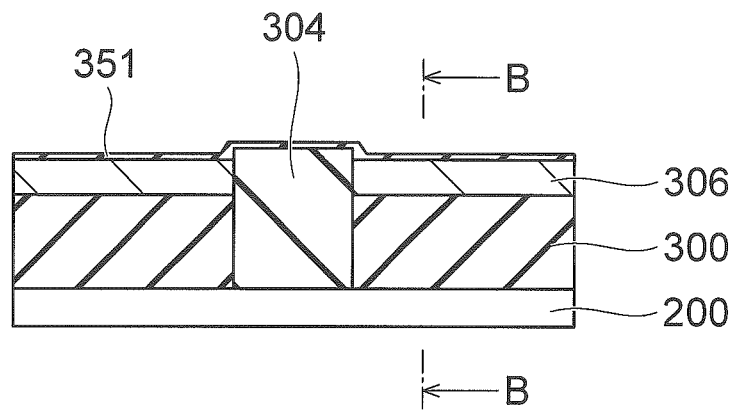
Figure 46B:
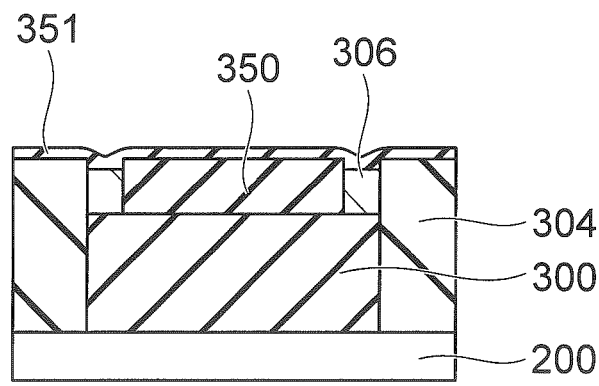

Thereafter, the soft magnetic layer 306 is etched so that the top surface of the soft magnetic layer 306 is lower than the top surface of the insulating layer 350 as shown in FIG. 45A and FIG. 45B. FIG. 45B is a cross sectional view cut along plane B-B in FIG. 45A. Subsequently, an insulating layer 351 of hafnium oxide, for example, is deposited on the entire surface as shown in FIGS. 46A and 46B. FIG. 46B is a cross sectional view cut along plane B-B in FIG. 46A.

Figure 47A:
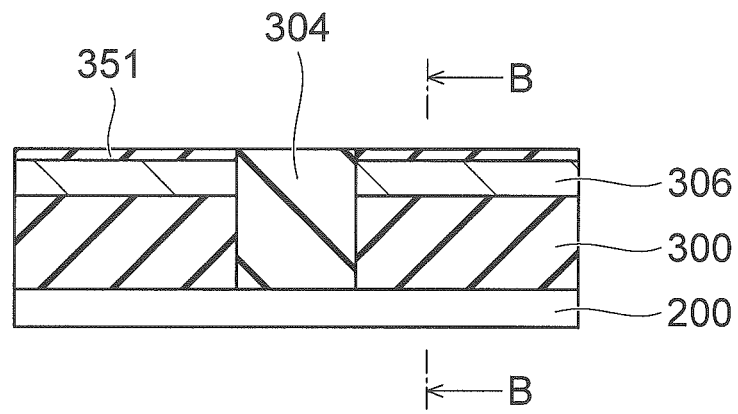
Figure 47B:
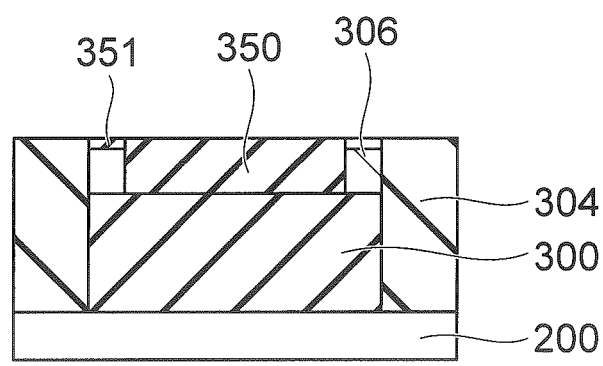
Figure 48A:
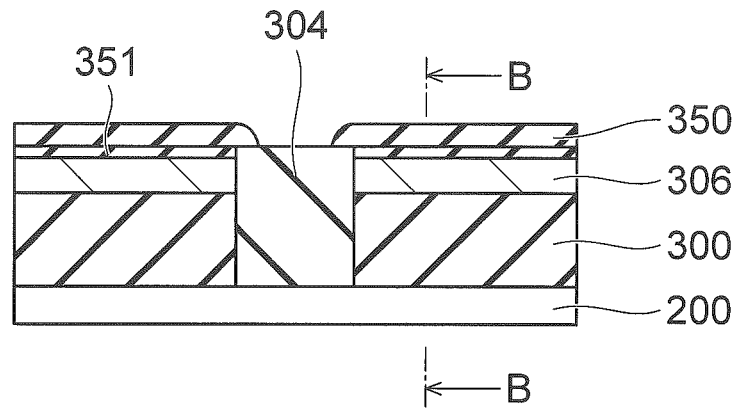
Figure 48B:
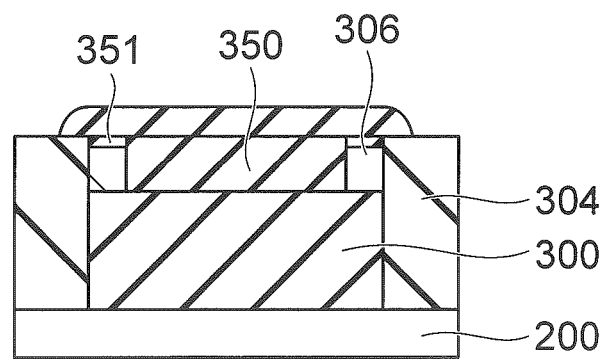

The insulating layer 351 is flattened by CMP as shown in FIGS. 47A and 47B so that the top surface of the insulating layer 351 is flush with the top surface of the TEOS layer 304. FIG. 47B is a cross sectional view cut along plane B-B in FIG. 47A. Subsequently, hafnium oxide is selectively deposited by atomic layer deposition (ALD), for example, as shown in FIGS. 48A and 48B. As a result, the insulating layer 350 of hafnium oxide on the soft magnetic layer 306 is made thicker. The hafnium oxide is also deposited on a portion of the TEOS layer 304. FIG. 48B is a cross sectional view cut along plane B-B in FIG. 48A.

Figure 49A:
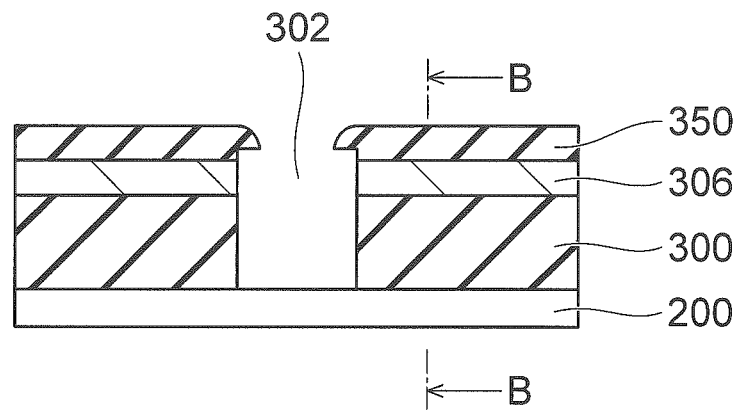
Figure 49B:
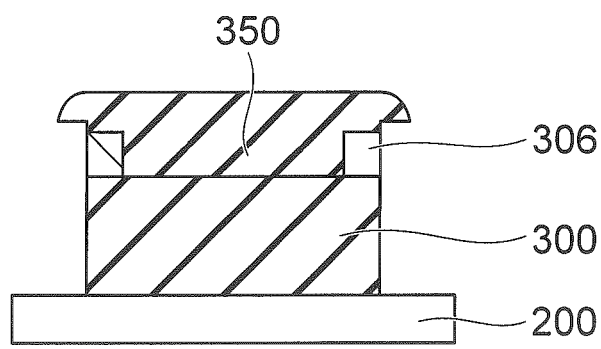

Subsequently, the TEOS layer 304 is removed so that the hole 302 is exposed as shown in FIGS. 49A and 49B. FIG. 49B is a cross sectional view cut along plane B-B in FIG. 49A.

A portion of the insulating layer 350 is left over the hole 302. Thereafter, the process shown in FIG. 29A is performed. As a result, an insulating layer (not shown) of aluminum oxide, for example, is formed on the top face and the side face of the insulating layer 350 and the side face of the hole 302.

Figure 50A:
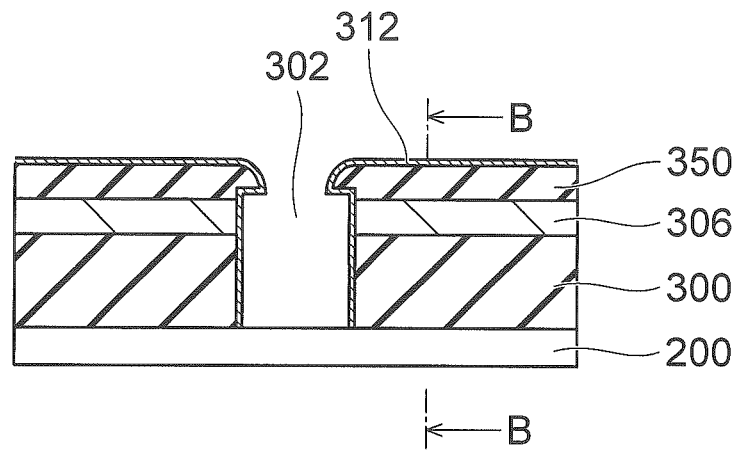
Figure 50B:
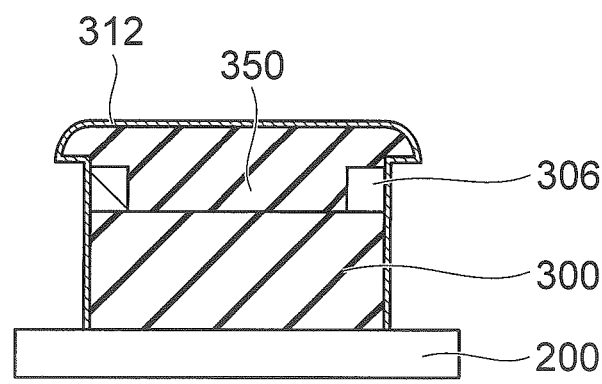
Figure 51A:
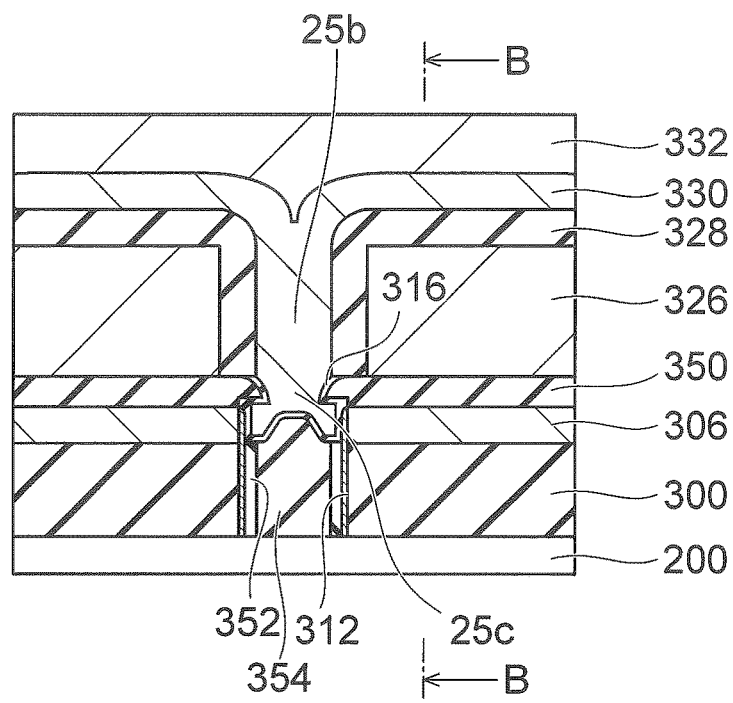
Figure 51B:
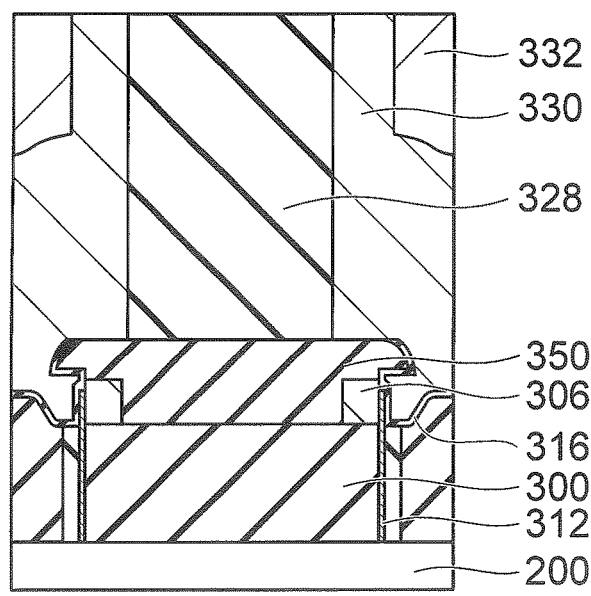

Subsequently, a magnetic material layer 312 to become the magnetic member $ML_{ij}$ (i, j=1, . . . , 4) shown in FIG. 1B is deposited on the top face and the side face of the insulating layer 350 and the side face of the hole 302, as shown in FIG. 50A and FIG. 50B. FIG. 50B is a cross sectional view cut along plane B-B in FIG. 50A. The magnetic material layer 312 may be a multilayer film having such a structure as W (tungsten)/CoFeB/MgO, for example. Thereafter, the processes of the second modification of the third embodiment shown in FIGS. 36A to 40 are performed. As the result, the structure shown in FIGS. 51A and 51B is obtained. The connection portion between the second portion 25c and the third portion 25b of the yoke has an inverted Y shape. Subsequently, the process shown in FIG. 26 of the third embodiment is performed to obtain the magnetic memory manufactured by the method according to the fourth embodiment.

As described above, the magnetic memory manufactured by the method according to the fourth embodiment is capable of preventing data from being fixed to an end of the magnetic member and the write efficiency from being reduced, like the magnetic memory according to the third embodiment. The magnetic memory manufactured by the method according to the fourth embodiment has the yoke in which the connection portion between the second portion and the third portion has an inverted Y shape. Therefore, the magnetic memory manufactured by the method according to the fourth embodiment may prevent a reduction in writing magnetic field more than the magnetic memory manufactured according to the third embodiment.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

The invention claimed is:

1. A magnetic memory comprising:
a first magnetic member including a first portion and a second portion and extending in a first direction from the first portion to the second portion;
a first wiring and a second wiring disposed to be apart from the first magnetic member and extending in a second direction that intersects the first direction, the first wiring and the second wiring being separated from each other in a third direction that intersects the first direction and the second direction, the first magnetic member being disposed to be apart from a region between the first wiring and the second wiring in the first direction; and
a second magnetic member surrounding at least a part of the first wiring and at least a part of the second wiring, the second magnetic member including a third portion that is located to be more distant from the first magnetic member than the first wiring and the second wiring in the first direction, a fourth portion that is located to be closer to the first magnetic member than the first wiring and the second wiring in the first direction and electrically connected to the first portion of the first magnetic member, and a fifth portion that is located in the region between the first wiring and the second wiring and electrically connected to the third portion and the fourth portion.

2. The magnetic memory according to claim 1, further comprising:
a first magnetoresistive element including a first terminal and a second terminal, the first terminal being electrically connected to the second portion;
a third wiring that is electrically connected to the second magnetic member;
a fourth wiring that is electrically connected to the second terminal; and
a first switching portion disposed between the second terminal and the fourth wiring.

3. The magnetic memory according to claim 1, wherein the second magnetic member includes a recess in a direction from the third portion to the fifth portion in a cross section taken along a plane including the first direction and the third direction.

4. The magnetic memory according to claim 1, wherein the second magnetic member includes a recess from the fourth portion to the fifth portion in a cross section taken along a plane including the first direction and the third direction.

5. The magnetic memory according to claim 1, wherein:
the fourth portion of the second magnetic member includes a sixth portion connected to the fifth portion, and a seventh portion disposed to be separate from the sixth portion in a direction that intersects the first direction; and
the sixth portion is electrically connected to the first magnetic member.

6. The magnetic memory according to claim 5, wherein the seventh portion is electrically isolated from the first magnetic member.

7. The magnetic memory according to claim 1, wherein when viewed from the first direction, the first magnetic member includes a portion overlapping the first wiring and a portion overlapping the second wiring.

8. The magnetic memory according to claim 1, wherein the first magnetic member has a cylindrical shape.

9. A magnetic memory comprising:
a first magnetic member including a first portion and a second portion and extending in a first direction from the first portion to the second portion;
a second magnetic member including a third portion and a fourth portion and extending in the first direction, the second magnetic member being located to be apart from the first magnetic member in a second direction that intersects the first direction;

a first wiring and a second wiring disposed to be apart from the first magnetic member and the second magnetic member and extending in the second direction, the first wiring and the second wiring being separated from each other in a third direction that intersects the first direction and the second direction, the first magnetic member and the second magnetic member being disposed to be apart from a region between the first wiring and the second wiring in the first direction;

a third magnetic member surrounding at least a first part of the first wiring and at least a first part of the second wiring, the third magnetic member including a fifth portion that is located to be more distant from the first magnetic member than the first wiring and the second wiring in the first direction, a sixth portion that is located to be closer to the first magnetic member than the first wiring and the second wiring in the first direction and electrically connected to the first portion of the first magnetic member, and a seventh portion that is located in the region between the first wiring and the second wiring and electrically connected to the fifth portion and the sixth portion; and a fourth magnetic member surrounding at least a second part of the first wiring and at least a second part of the second wiring, the fourth magnetic member including an eighth portion that is located to be more distant from the second magnetic member than the first wiring and the second wiring in the first direction, a ninth portion that is located to be closer to the second magnetic member than the first wiring and the second wiring in the first direction and electrically connected to the third portion of the second magnetic member, and a tenth portion that is located in the region between the first wiring and the second wiring and electrically connected to the eighth portion and the ninth portion.

10. The magnetic memory according to claim 9, further comprising:
a first magnetoresistive element including a first terminal and a second terminal, the first terminal being electrically connected to the second portion;
a second magnetoresistive element including a third terminal and a fourth terminal, the third terminal being electrically connected to the fourth portion;
a third wiring that is electrically connected to the third magnetic member;
a fourth wiring that is electrically connected to the fourth magnetic member;
a fifth wiring that is electrically connected to the second terminal and the fourth terminal and extends in the second direction;
a first switching portion disposed between the second terminal and the fifth wiring; and
a second switching portion disposed between the fourth terminal and the fifth wiring.

11. The magnetic memory according to claim 9, wherein the third magnetic member and the fourth magnetic member are separated from each other.

12. The magnetic memory according to claim 9, wherein a part of the third magnetic member and a part of the fourth magnetic member are connected to each other.

13. The magnetic memory according to claim 9, wherein:
the third magnetic member includes a recess from the fifth portion to the seventh portion in a cross section taken along a plane including the first direction and the third direction; and the fourth magnetic member includes a recess from the eighth portion to the tenth portion in a cross section taken along a plane including the first direction and the third direction.

14. The magnetic memory according to claim 9, wherein:
the third magnetic member includes a recess from the sixth portion to the seventh portion in a cross section taken along a plane including the first direction and the third direction; and
the fourth magnetic member includes a recess from the ninth portion to the tenth portion in a cross section taken along a plane including the first direction and the third direction.

15. The magnetic memory according to claim 9, wherein:
the sixth portion of the third magnetic member includes an eleventh portion connected to the seventh portion, and a twelfth portion disposed to be apart from the eleventh portion in a direction that intersects the first direction, the eleventh portion being electrically connected to the first magnetic member; and
the ninth portion of the fourth magnetic member includes a thirteenth portion connected to the tenth portion, and a fourteenth portion disposed to be apart from the thirteenth portion in a direction that intersects the first direction, the thirteenth portion being electrically connected to the second magnetic member.

16. The magnetic memory according to claim 15, wherein the twelfth portion is electrically isolated from the first magnetic member, and the fourteenth portion is electrically isolated from the second magnetic member.

17. The magnetic memory according to claim 16, wherein the twelfth portion is electrically connected to the fourteenth portion.

18. The magnetic memory according to claim 9, wherein:
the first magnetic member includes a portion overlapping the first wiring and a portion overlapping the second wiring when viewed from the first direction; and
the second magnetic member includes a portion overlapping the first wiring and a portion overlapping the second wiring when viewed from the first direction.

19. The magnetic memory according to claim 9, wherein the first magnetic member and the second magnetic member have a cylindrical shape.

20. The magnetic memory according to claim 9, further comprising:
a fifth magnetic member including a fifteenth portion and a sixteenth portion and extending in the first direction, the fifth magnetic member being disposed to be apart from the first magnetic member in a fourth direction that is different from the second direction and the third direction in a plane including the second direction and the third direction; and
a sixth wiring extending in the second direction to be apart from the fifth magnetic member and apart from the second wiring in the third direction, the fifth magnetic member being disposed to be apart from a region between the second wiring and the sixth wiring in the first direction,
wherein the third magnetic member extends in the fourth direction and surrounds at least a portion of the sixth wiring.

21. The magnetic memory according to claim 20, further comprising:
a third magnetoresistive element including a fifth terminal and a six terminal, the fifth terminal being electrically connected to the sixteenth portion;

a seventh wiring electrically connected to the six terminal and extending in the second direction; and a third switching portion disposed between the six terminal and the seventh wiring.

22. A magnetic memory comprising:
- a first magnetic member including a first portion and a second portion and extending in a first direction from the first portion to the second portion;
- a first wiring and a second wiring disposed to be apart from the first magnetic member and extending in a second direction that intersects the first direction, the first wiring and the second wiring being separated from each other in a third direction that intersects the first direction and the second direction, the first magnetic member being disposed to be apart from a region between the first wiring and the second wiring in the first direction; and
- a second magnetic member surrounding at least a part of the first wiring and at least a part of the second wiring and electrically connected to the first magnetic member.

\* \* \* \* \*

UNITED STATES PATENT AND TRADEMARK OFFICE
CERTIFICATE OF CORRECTION

| | | |
|---|---|---|
| PATENT NO. | : 11,711,925 B2 | Page 1 of 1 |
| APPLICATION NO. | : 17/189107 | |
| DATED | : July 25, 2023 | |
| INVENTOR(S) | : Hiroki Tokuhira et al. | |

It is certified that error appears in the above-identified patent and that said Letters Patent is hereby corrected as shown below:

On the Title Page

• Item (57), Line 2 of ABSTRACT, "a first and second portions" should read --first and second portions--.

• Item (57), Line 3 of ABSTRACT, "a first and second wirings" should read --first and second wirings--.

In the Claims

• Claim 21, Column 18, Lines 65-66, "a fifth terminal and a six terminal" should read --a fifth terminal and a sixth terminal--.

• Claim 21, Column 19, Line 1, "a seventh wiring electrically connected to the six terminal" should read --a seventh wiring electrically connected to the sixth terminal--.

• Claim 21, Column 19, Lines 4-5, "disposed between the six terminal and the seventh wiring" should read --disposed between the sixth terminal and the seventh wiring--.

Signed and Sealed this
Twenty-sixth Day of September, 2023

Katherine Kelly Vidal
*Director of the United States Patent and Trademark Office*